(12) United States Patent
Tomura et al.

(10) Patent No.: US 8,895,359 B2
(45) Date of Patent: Nov. 25, 2014

(54) SEMICONDUCTOR DEVICE, FLIP-CHIP MOUNTING METHOD AND FLIP-CHIP MOUNTING APPARATUS

(75) Inventors: Yoshihiro Tomura, Osaka (JP); Kazumichi Shimizu, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 835 days.

(21) Appl. No.: 13/056,462

(22) PCT Filed: Nov. 6, 2009

(86) PCT No.: PCT/JP2009/005890
§ 371 (c)(1),
(2), (4) Date: Jan. 28, 2011

(87) PCT Pub. No.: WO2010/070806
PCT Pub. Date: Jun. 24, 2010

(65) Prior Publication Data
US 2011/0175237 A1  Jul. 21, 2011

(30) Foreign Application Priority Data

Dec. 16, 2008 (JP) ................................. 2008-319040
Dec. 26, 2008 (JP) ................................. 2008-331662

(51) Int. Cl.
*H01L 21/00* (2006.01)
*H01L 21/44* (2006.01)
(Continued)

(52) U.S. Cl.
CPC ............ *H01L 21/563* (2013.01); *H01L 21/565* (2013.01); *H01L 23/3142* (2013.01); *H01L*
(Continued)

(58) Field of Classification Search
CPC ................. H01L 2924/00; H01L 2924/00014; H01L 2224/3225; H01L 2224/16225; H01L 2224/48227; H01L 2924/0665; H01L 2224/2919; H01L 2224/73204; H01L 2224/83192; H01L 24/75; H01L 2924/3512; H01L 21/563; H01L 21/565; H01L 2224/32; H01L 2224/75; H01L 2224/75303; H01L 2224/81191; H01L 2224/81203; H01L 2224/83203; H01L 2224/9221; H01L 23/3142; H01L 24/16; H01L 24/32; H01L 24/81; H01L 24/83
USPC ......... 257/737, 738, 778, 779, 780, 632, 635, 257/638, 704, E23.133; 438/108, 118, 106, 438/125, 126, 127, 138, 612, 613, 343, 372, 438/376
See application file for complete search history.

(56) References Cited

U.S. PATENT DOCUMENTS 5,278,429 A * 1/1994 Takenaka et al. ............. 257/678
5,358,906 A * 10/1994 Lee .................................. 29/827
(Continued)

FOREIGN PATENT DOCUMENTS

JP    2000-100862    4/2000
JP    2000-277566    10/2000
(Continued)

*Primary Examiner* — Teresa M Arroyo
(74) *Attorney, Agent, or Firm* — Hamre, Schumann, Mueller & Larson, P.C.

(57) ABSTRACT

A semiconductor chip (1) is flip-chip mounted on a circuit board (4) with an underfill resin (6) interposed between the semiconductor chip (1) and the circuit board (4) and a container covering the semiconductor chip (1) is bonded on the circuit board (4). At this point, the semiconductor chip (1) positioned with the underfill resin (6) interposed between the circuit board (4) and the semiconductor chip (1) is pressed and heated by a pressure-bonding tool (8); meanwhile, the surface of the underfill resin (6) protruding around the semiconductor chip (1) is pressed by the pressure-bonding tool (8) through a film (13) on which a surface unevenness is formed in a periodically repeating pattern, so that a surface unevenness (16a) is formed. The inner surface of the container covering the semiconductor chip (1) is bonded to the surface unevenness (16a) on the surface of the underfill resin.

2 Claims, 26 Drawing Sheets

(51) Int. Cl.
*H01L 23/58* (2006.01)
*H01L 23/12* (2006.01)
*H01L 23/48* (2006.01)
*H01L 23/52* (2006.01)
*H01L 29/40* (2006.01)
*H01L 21/56* (2006.01)
*H01L 23/31* (2006.01)
*H01L 23/00* (2006.01)

(52) U.S. Cl.
CPC ........ *24/75* (2013.01); *H01L 24/81* (2013.01); *H01L 24/83* (2013.01); H01L 21/568 (2013.01); *H01L 23/3121* (2013.01); H01L 24/16 (2013.01); H01L 24/32 (2013.01); H01L 2224/1134 (2013.01); H01L 2224/13124 (2013.01); H01L 2224/13144 (2013.01); H01L 2224/13147 (2013.01); H01L 2224/13155 (2013.01); H01L 2224/13164 (2013.01); H01L 2224/16225 (2013.01); H01L 2224/32 (2013.01); H01L 2224/73204 (2013.01); H01L 2224/75 (2013.01); H01L 2224/75303 (2013.01); H01L 2224/75313 (2013.01); H01L 2224/75315 (2013.01); H01L 2224/75317 (2013.01); H01L 2224/81001 (2013.01); H01L 2224/81005 (2013.01); H01L 2224/81191 (2013.01); H01L 2224/81203 (2013.01); H01L 2224/81801 (2013.01); H01L 2224/83192 (2013.01); H01L 2224/83203 (2013.01); H01L 2224/83856 (2013.01); H01L 2224/9221 (2013.01); H01L 2924/01004 (2013.01); H01L 2924/01005 (2013.01); H01L 2924/01013 (2013.01); H01L 2924/01029 (2013.01); H01L 2924/01033 (2013.01); H01L 2924/01046 (2013.01); H01L 2924/01058 (2013.01); H01L 2924/01078 (2013.01); H01L 2924/01079 (2013.01); H01L 2924/01082 (2013.01); H01L 2924/3025 (2013.01); H01L 2224/2919 (2013.01); H01L 2924/01006 (2013.01); H01L 2924/0105 (2013.01); H01L 2924/014 (2013.01); H01L 2924/0665 (2013.01); H01L 2224/32225 (2013.01); H01L 2224/48227 (2013.01); H01L 2924/07811 (2013.01); H01L 2924/00 (2013.01); H01L 2924/3512 (2013.01)

USPC ........... 438/108; 438/106; 438/118; 438/125; 438/126; 438/127; 438/612; 438/613; 257/632; 257/635; 257/638; 257/704; 257/778

(56) References Cited

U.S. PATENT DOCUMENTS

| | | | |
|---|---|---|---|
| 6,204,454 B1 * | 3/2001 | Gotoh et al. | 174/255 |
| 6,400,014 B1 * | 6/2002 | Huang et al. | 257/712 |
| 6,523,734 B1 * | 2/2003 | Kawai et al. | 228/110.1 |
| 6,590,287 B2 | 7/2003 | Ohuchi | |
| 6,744,122 B1 * | 6/2004 | Hashimoto | 257/668 |
| 6,754,950 B2 * | 6/2004 | Furukawa et al. | 29/832 |
| 6,917,745 B2 * | 7/2005 | Murata | 385/137 |
| 7,061,097 B2 * | 6/2006 | Yokoi | 257/700 |
| 7,790,515 B2 | 9/2010 | Jobetto | |
| 8,163,599 B2 * | 4/2012 | Tomura et al. | 438/107 |
| 8,314,495 B2 * | 11/2012 | Hayashi et al. | 257/773 |
| 8,486,212 B2 * | 7/2013 | Hamazaki | 156/228 |
| 2002/0033525 A1 | 3/2002 | Ohuchi | |
| 2002/0089067 A1 | 7/2002 | Crane et al. | |
| 2003/0059978 A1 * | 3/2003 | Suzuki et al. | 438/106 |
| 2005/0093181 A1 * | 5/2005 | Brandenburg et al. | 257/796 |
| 2005/0095746 A1 | 5/2005 | Aoyagi | |
| 2005/0110165 A1 * | 5/2005 | Ogata | 257/780 |
| 2005/0136570 A1 * | 6/2005 | Suehiro et al. | 438/118 |
| 2005/0224969 A1 | 10/2005 | Wu | |
| 2005/0253276 A1 * | 11/2005 | Yamanaka et al. | 257/778 |
| 2006/0223231 A1 * | 10/2006 | Koiwa et al. | 438/108 |
| 2007/0072339 A1 * | 3/2007 | Chen et al. | 438/106 |
| 2008/0108179 A1 * | 5/2008 | Mistry et al. | 438/117 |
| 2008/0122087 A1 | 5/2008 | Jobetto | |
| 2008/0284015 A1 * | 11/2008 | Robles et al. | 257/737 |
| 2012/0241942 A1 * | 9/2012 | Ihara | 257/712 |

FOREIGN PATENT DOCUMENTS

| | | |
|---|---|---|
| JP | 2002-016104 | 1/2002 |
| JP | 2002-118209 | 4/2002 |
| JP | 2002-170900 | 6/2002 |
| JP | 2004-179552 | 6/2004 |
| JP | 2005-101170 | 4/2005 |
| JP | 2005-303021 | 10/2005 |
| JP | 2006-128488 | 5/2006 |
| JP | 2007-180062 | 7/2007 |
| JP | 2008-135521 | 6/2008 |

* cited by examiner

SEMICONDUCTOR DEVICE, FLIP-CHIP MOUNTING METHOD AND FLIP-CHIP MOUNTING APPARATUS

TECHNICAL FIELD

The present invention relates to a semiconductor device and a flip-chip mounting method.

BACKGROUND ART

In recent years, small and thin electronic equipment has been demanded and thus semiconductor devices have been requested to have bare semiconductor chips directly mounted on circuit boards (bare chip mounting). Particularly, semiconductor devices have been demanded in which the circuit surfaces of semiconductor chips are opposed to circuit boards (flip-chip mounting).

In a flip-chip semiconductor device of the related art, as shown in FIG. 45, a semiconductor chip 51 having internal connection terminals such as metal bump electrodes is mounted on a circuit board 50 by flip-chip connection. Reference numeral 52 denotes an anisotropic conductive adhesive.

In this semiconductor device, an external force applied to the semiconductor chip 51 may damage the anisotropic conductive adhesive 52, causing faulty electrical connection between the circuit board 50 and the semiconductor chip 51.

In Patent Literature 1, as shown in FIG. 46, surface unevenness 53 is formed on a portion (fillet) of the anisotropic conductive adhesive 52 protruding from the outer circumference of the semiconductor chip 51. Thus it is possible to improve the mechanical strength of the anisotropic conductive adhesive 52 and reduce the occurrence of faulty electrical connection between the circuit board 50 and the semiconductor chip 51.

In Patent Literature 2, in order to increase a radiating area in the resin molding of circuit components, a plurality of holes are formed by a jet of air on the surface of a molding resin covering the circuit components.

CITATION LIST

Patent Literature

Patent Literature 1: Japanese Patent Laid-Open No. 2000-277566
Patent Literature 2: Japanese Patent Laid-Open No. 2007-180062

SUMMARY OF INVENTION

Technical Problem

In the flip-chip mounting method of Patent Literature 1, the surface unevenness 53 is formed on the fillet by controlling the process of heating the anisotropic conductive adhesive 52, so that the surface unevenness is smoothed and varied in shape.

Further, the semiconductor device becomes less reliable in a hot and humid environment because moisture easily enters an electrical connection point between the circuit board 50 and the semiconductor chip 51.

Hence, a container may be integrally formed on the configuration of FIG. 46 or a container may be integrally formed on the molding resin on which the plurality of holes have been formed according to Patent Literature 2, thereby achieving a semiconductor device with higher reliability in terms of mechanical strength and electrical connection than in the related art. In either case, surface unevenness cannot be stably formed on the surface of the molding resin before the formation of the container. Thus the container easily comes off and the mechanical strength cannot be increased under present circumstances.

An object of the present invention is to provide a semiconductor device having surface unevenness stably formed on the fillet with higher reliability in terms of mechanical strength and electrical connection than in the related art, and a flip-chip mounting method achieving the semiconductor device.

Solution to Problem

A flip-chip mounting method of the present invention, when a semiconductor chip is flip-chip mounted on a circuit board with an underfill resin interposed between the semiconductor chip and the circuit board and a container covering the semiconductor chip is bonded on the circuit board, the flip-chip mounting method including: forming a surface unevenness in a periodically repeating pattern on the surface of the underfill resin protruding around the semiconductor chip, when a pressure-bonding tool presses and heats the semiconductor chip positioned with the underfill resin interposed between the circuit board and the semiconductor chip; and bonding the inner surface of the container covering the semiconductor chip to the surface unevenness on the surface of the underfill resin. To be specific, the surface unevenness is formed by pressing the pressure-bonding tool to and around the semiconductor chip through a film and transferring a periodically repeating unevenness pattern on the surface of the film to the surface of the underfill resin protruding around the semiconductor chip. Further, the surface unevenness is formed by pressing the pressure-bonding tool to and around the semiconductor chip through a film and transferring a periodically repeating unevenness pattern on the surface of the pressure-bonding tool to the surface of the underfill resin protruding around the semiconductor chip.

A flip-chip mounting method according to the present invention includes: forming a surface unevenness in a periodically repeating pattern on the surface of an underfill resin protruding around a semiconductor chip, when a pressure-bonding tool presses and heats the semiconductor chip positioned with the underfill resin interposed between a circuit board and the semiconductor chip; forming a cavity by setting a forming die on the circuit board and the semiconductor chip flip-chip mounted on the circuit board; and molding a container by injecting resin into the cavity and curing the resin.

A flip-chip mounting apparatus according to the present invention is a flip-chip mounting apparatus for flip-chip mounting a semiconductor chip on a circuit board with an underfill resin interposed between the semiconductor chip and the circuit board, and bonding a container on the circuit board such that the container covers the semiconductor chip, the flip-chip mounting apparatus including: a film that is supported above the semiconductor chip positioned with the underfill resin interposed between the circuit board and the semiconductor chip, and has a periodically repeating unevenness pattern on the surface of the film such that the unevenness pattern faces the semiconductor chip; a pressure-bonding tool for pressing the semiconductor chip and the underfill resin protruding around the semiconductor chip, to the circuit board with heat through the film; and a forming die that is placed on the circuit board and the semiconductor chip flip-chip mounted on the circuit board and forms a cavity.

A flip-chip mounting apparatus according to the present invention is a flip-chip mounting apparatus for flip-chip mounting a semiconductor chip on a circuit board with an underfill resin interposed between the semiconductor chip and the circuit board, and bonding a container on the circuit board such that the container covers the semiconductor chip, the flip-chip mounting apparatus including: a film that is supported above the semiconductor chip positioned with the underfill resin interposed between the circuit board and the semiconductor chip; a pressure-bonding tool that presses the semiconductor chip and the underfill resin protruding around the semiconductor chip, to the circuit board with heat through the film, and has a periodically repeating unevenness pattern on the surface of the pressure-bonding tool such that the unevenness pattern faces the semiconductor chip; and a forming die that is placed on the circuit board and the semiconductor chip flip-chip mounted on the circuit board and forms a cavity.

A flip-chip mounting method of the present invention, when a semiconductor chip is flip-chip mounted on a circuit board with an underfill resin interposed between the semiconductor chip and the circuit board and a container covering the semiconductor chip is bonded on the circuit board, the flip-chip mounting method including: forming an unevenness layer in a periodically repeating pattern by pressing and heating, by a pressure-bonding tool, the semiconductor chip positioned with the underfill resin interposed between the circuit board and the semiconductor chip, and applying a second resin for forming a surface unevenness to the surface of the underfill resin protruding around the semiconductor chip; and bonding the inner surface of the container covering the semiconductor chip to the unevenness layer on the surface of the underfill resin. To be specific, the second resin is applied in one of a mesh pattern, a string pattern, and a punched pattern on the surface of the underfill resin. Moreover, the second resin is a conductive resin.

A flip-chip mounting method of the present invention, when a semiconductor chip is flip-chip mounted on a circuit board with an underfill resin interposed between the semiconductor chip and the circuit board and a container covering the semiconductor chip is bonded on the circuit board, the flip-chip mounting method including: forming an unevenness layer by pressing and heating, by a pressure-bonding tool, the semiconductor chip positioned with the underfill resin interposed between the circuit board and the semiconductor chip, and applying a film sheet to the surface of the underfill resin protruding around the semiconductor chip, the film sheet having a surface unevenness in a periodically repeating pattern on the surface of the film sheet; and bonding the inner surface of the container covering the semiconductor chip to the unevenness layer on the surface of the underfill resin.

A semiconductor device of the present invention includes: a semiconductor chip that is flip-chip mounted on a circuit board via an underfill resin and has a periodically repeating unevenness pattern on the surface of the underfill resin; and a container that is resin-molded on the circuit board so as to cover the semiconductor chip and come into contact with the unevenness pattern formed on a part of the semiconductor chip.

A semiconductor device of the present invention includes: a semiconductor chip that is flip-chip mounted on a circuit board via an underfill resin and has a periodically repeating unevenness pattern transferred on the surface of the underfill resin; and a container that is resin-molded on the circuit board so as to cover the semiconductor chip and come into contact with the unevenness pattern formed on a part of the semiconductor chip.

A semiconductor device according to the present invention includes: a semiconductor chip that is flip-chip mounted on a circuit board via an underfill resin and has a periodically repeating unevenness pattern on the surface of the underfill resin, the unevenness pattern being formed by applying resin; and a container that is resin-molded on the circuit board so as to cover the semiconductor chip and come into contact with the unevenness pattern formed on a part of the semiconductor chip.

A semiconductor device according to the present invention includes: a semiconductor chip flip-chip mounted on a circuit board via an underfill resin; a film sheet in a net pattern covering the semiconductor chip and the surface of the underfill resin; and a container resin-molded on the circuit board so as to cover the semiconductor chip and come into contact with the film sheet.

A semiconductor device according to the present invention includes: a semiconductor chip flip-chip mounted on a circuit board via an underfill resin; a film sheet that has an opening at the center of the film sheet so as to expose the top surface of the semiconductor chip, has a net pattern around the opening, and covers the surface of the underfill resin; and a container resin-molded on the circuit board so as to come into contact with the film sheet and cover the semiconductor chip. To be specific, the film sheet is conductive and is electrically connected to the reference potential of the circuit board.

Advantageous Effects of Invention

According to this configuration, a surface unevenness (dimple part) in a periodically repeating pattern is formed on the surface of an underfill resin protruding around a semiconductor chip. Additionally, a container covering the semiconductor chip is attached and the inner surface of the container is bonded to the surface unevenness on the surface of the underfill resin. Thus it is possible to provide a semiconductor device with highly reliable electrical and mechanical connection.

Further, an unevenness pattern formed on the surface of the film or the pressure-bonding tool is transferred to the underfill resin to form the surface unevenness. The surface unevenness is stably formed in a periodically repeating pattern on the underfill resin.

According to this configuration, an unevenness layer in a periodically repeating pattern is formed by applying a second resin for forming a surface unevenness to the surface of the underfill resin protruding around the semiconductor chip, and the inner surface of the container covering the semiconductor chip is bonded to the unevenness layer on the surface of the underfill resin. Thus it is possible to obtain a semiconductor device with a mechanical strength. Moreover, the second resin of a conductive resin is connected to the reference potential of the circuit board achieving a semiconductor device with highly reliable mechanical and electrical connection.

DESCRIPTION OF EMBODIMENTS

Figure 1:
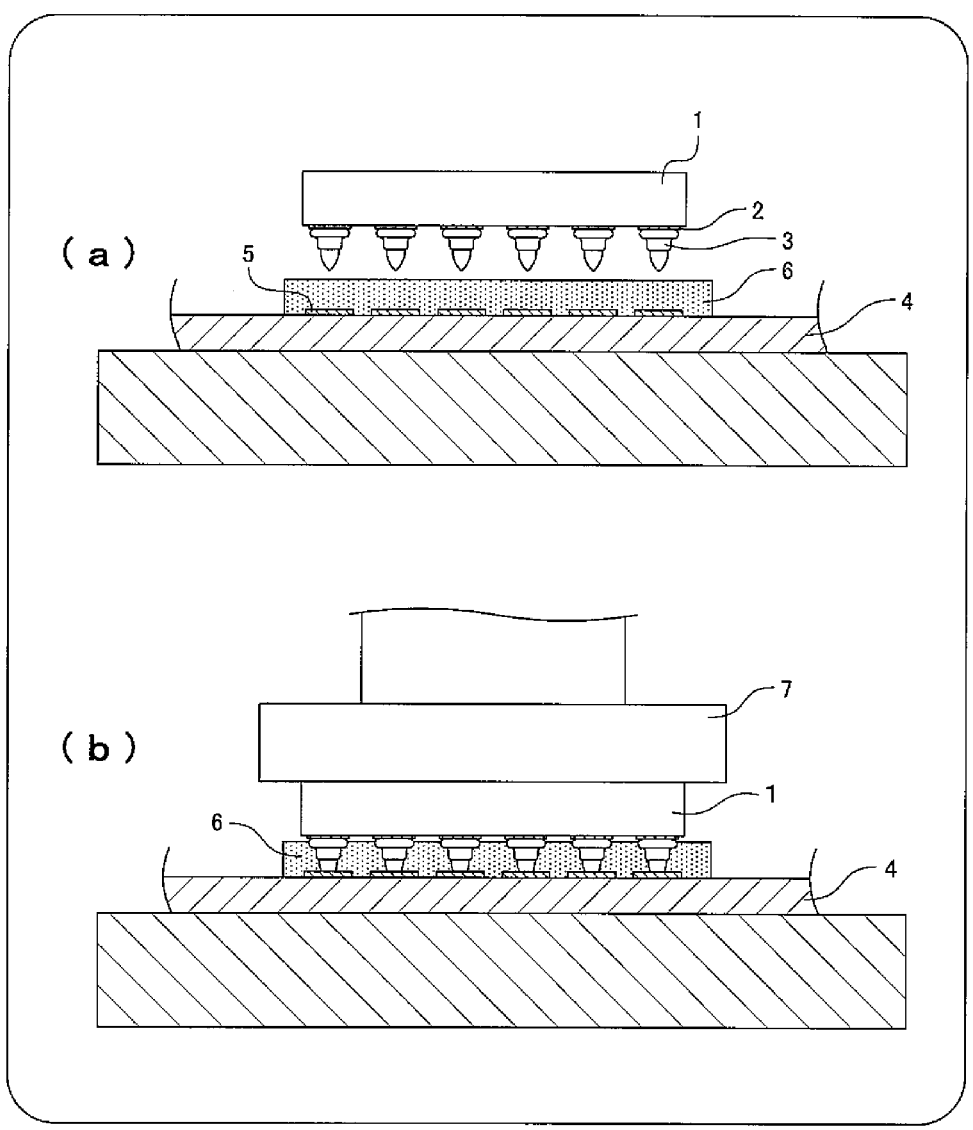
FIG. 1 is a sectional view showing a flip-chip mounting process according to a first embodiment of the present invention.

Referring to FIGS. 1 to 44, the following will describe embodiments of the present invention.

First Embodiment

FIGS. 1 to 15 show a first embodiment of the present invention.

FIGS. 1 to 13 show a flip-chip mounting process. FIG. 13 shows a completed semiconductor device.

First, an upstream process in FIGS. 1(a) and 1(b) will be described below.

As shown in FIG. 1(a), bumps 3 are formed on electrode pads 2 of a semiconductor chip 1. The semiconductor chip 1 was 0.15 mm to 0.2 mm in thickness. The bumps 3 are mainly made of at least one of gold, copper, palladium, nickel, tin, aluminum, and solder. The bumps 3 may be stud bumps or torn bumps formed by a known wire bonding method. Further, wires for forming the bumps 3 may contain trace elements. In this case, the bumps were about 50 μm in height and the bump pedestals were 55 μm in diameter. The bumps 3 may be formed by a known plating method or a known printing method.

A circuit board 4 having a thickness of 0.2 mm to 0.4 mm is a glass epoxy circuit board (may be an aramid circuit board, a silicon circuit board, or a silicon interposer) and terminal electrodes 5 made of copper (may be plated with nickel and gold) are formed on the top surface of the circuit board 4. On the circuit board 4 and the terminal electrodes 5, an insulating resin 6 is bonded as an underfill resin that has been cut slightly larger than the semiconductor chip 1 as needed. In this configuration, the insulating resin 6 was an epoxy resin cured at 180° C.

As shown in FIG. 1(b), the semiconductor chip 1 is sucked by a mounting tool 7 and the bumps 3 of the semiconductor chip 1 are mounted on the respective terminal electrodes 5 such that the bumps 3 are placed at desired positions of the terminal electrodes 5 on the circuit board 4. At this point, the bumps 3 stick into the insulating resin 6. Some of the bumps 3 penetrate the insulating resin 6 and are deformed in contact with the terminal electrodes 5. The bumps 3 are positioned with a load of about 10 g. The mounting tool 7 may be heated by a heater included in the mounting tool 7 but the resin should not be completely cured. The mounting tool 7 is removed after the semiconductor chip 1 is mounted.

Further, the circuit board 4 may be heated beforehand at about 50° C. to 80° C. such that the insulating resin 6 is adhesive enough to be bonded on the circuit board 4, or the tool of a bonding device (not shown) may be heated. The bonding load is 5 kgf/cm$^2$ to 10 kgf/cm$^2$. The insulating resin 6 was 50 μm in thickness. When the insulating resin 6 has two layers including a protective separator (not shown), the protective separator is removed. The insulating resin of the insulating resin 6 may be, for example, an epoxy resin, a phenol resin, a polyimide, insulating thermoplastic resins such as polyphenylene sulfide (PPS), a polycarbonate, a modified polyphenylene oxide (PPO), or a mixture of the insulating thermosetting resins and the insulating thermoplastic resins. An inorganic filler amount was 50 wt %. The filler amount is determined by a stress generated by the thermal expansion and warpage of the semiconductor chip 1 and the circuit board 4. Alternatively, the filler amount is determined by the reliability of moisture-resistant adhesion in a moisture absorption reflow test or a moisture bias test. The insulating resin 6 preferably has reflow heat resistance (for ten seconds at 265° C.)

In the subsequent process, on the semiconductor chip 1 mounted as shown in FIG. 1(b), a film 13 is pressed by a pressure-bonding tool 8 shown in FIGS. 2 to 7, so that the fillet of the insulating resin 6 is formed. The pressure-bonding tool 8 is made up of a pressing part 9 and a frame 10 that is attached to the underside of the pressing part 9 with a screw 11 in a replaceable manner. The frame 10 may be made of materials such as a thermosetting epoxy resin, a phenol resin, a polyimide, a silicone, a fluorocarbon resin, and a rubber resin, or a mixture of the insulating thermosetting resins and the insulating thermoplastic resins.

Figure 2:
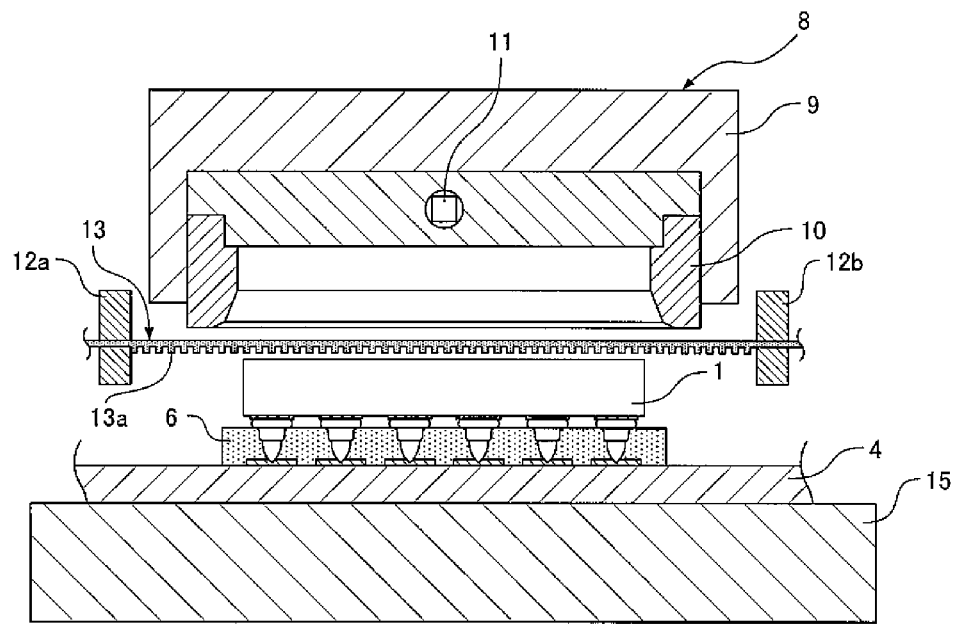
FIG. 2 is a sectional view showing the flip-chip mounting process according to the first embodiment.
Figure 14:
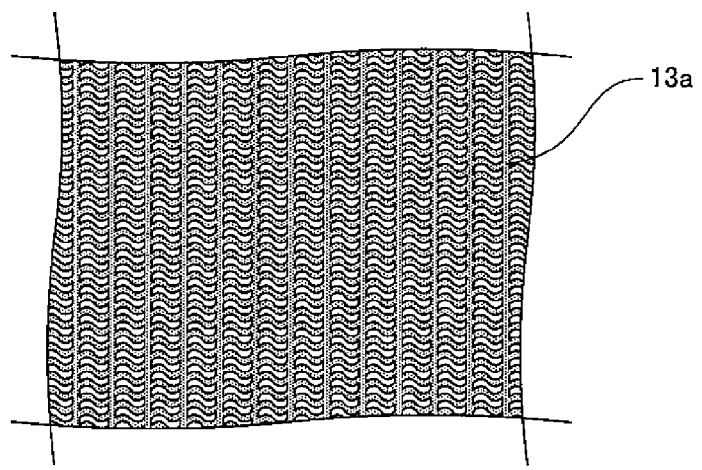
FIG. 14 is a plan view showing a film according to the first embodiment.

In FIG. 2, the film 13 stretched between support members 12a and 12b is provided between the pressure-bonding tool 8 and a stage 15, and the semiconductor chip 1 mounted as shown in FIG. 1(b) is set on the stage 15 provided below the film 13. The film 13 is larger in size than the semiconductor chip 1 in the vertical and horizontal directions. The film 13 is desirably resistant to heat (NCF curing temperature). The film 13 is preferably made of materials such as a polyimide, polyphenylene sulfide, a fluorocarbon resin, and a silicone rubber, or is preferably a heat-resistant thermoplastic film having a two-layer structure or the like. In this configuration, the film 13 was about 20 μm to 30 μm in thickness. On the underside of the film 13, an unevenness pattern 13a is formed that is a periodically repeating pattern. FIG. 14 is an enlarged view of the unevenness pattern 13a. To be specific, the periodically repeating pattern is a wavy pattern of about 3 mm. The wavy pattern is formed with a 1-mm pitch having a width of 0.5 mm and a thickness of 0.5 mm, while being pressure heated by a wavy recessed roller during the fabrication of the film 13.

Figure 3:
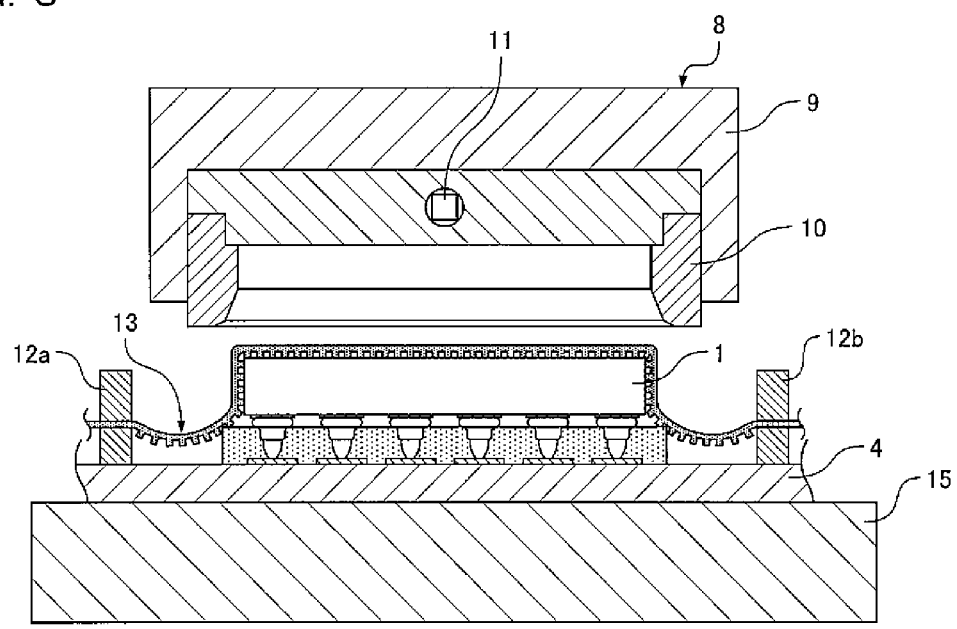
FIG. 3 is a sectional view showing the flip-chip mounting process according to the first embodiment.

In FIG. 3, the support members 12a and 12b are moved down toward the stage 15 and brought into contact with the circuit board 4, and then the support members 12a and 12b loosen the tension of the film 13, so that the film 13 is placed substantially on the semiconductor chip 1 and the insulating resin 6 bonded so as to protrude around the semiconductor chip 1.

Figure 4:
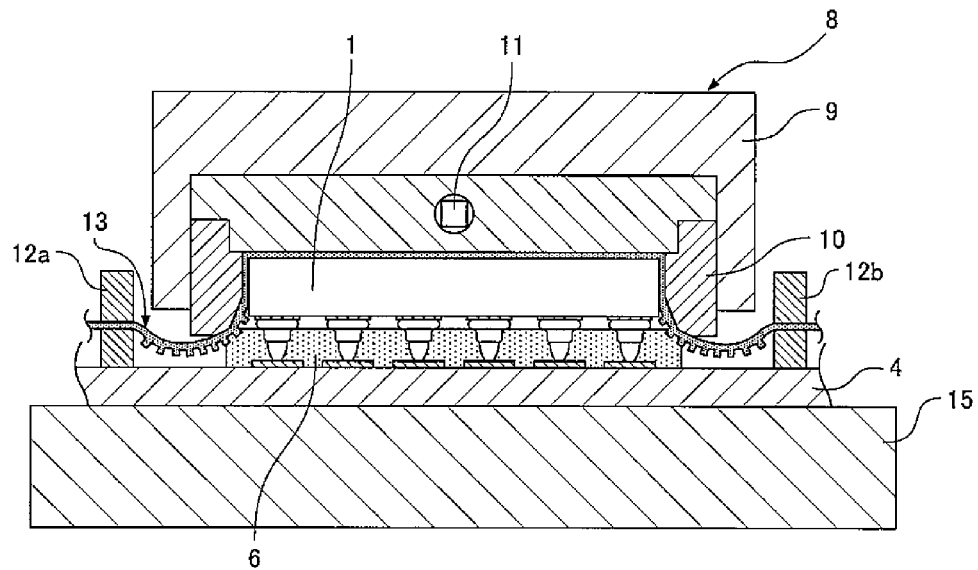
FIG. 4 is a sectional view showing the flip-chip mounting process according to the first embodiment.

In FIG. 4, the pressure-bonding tool 8 is further moved down toward the stage 15 so as to cover the semiconductor chip 1 with the frame 10, and the top surface of the semiconductor chip 1 and the fillet of the insulating resin 6 are pressed while being heated through the film 13.

The film 13 may be guided onto the insulating resin 6 by suction or the like from the circuit board 4 or the stage 15.

Figure 5:
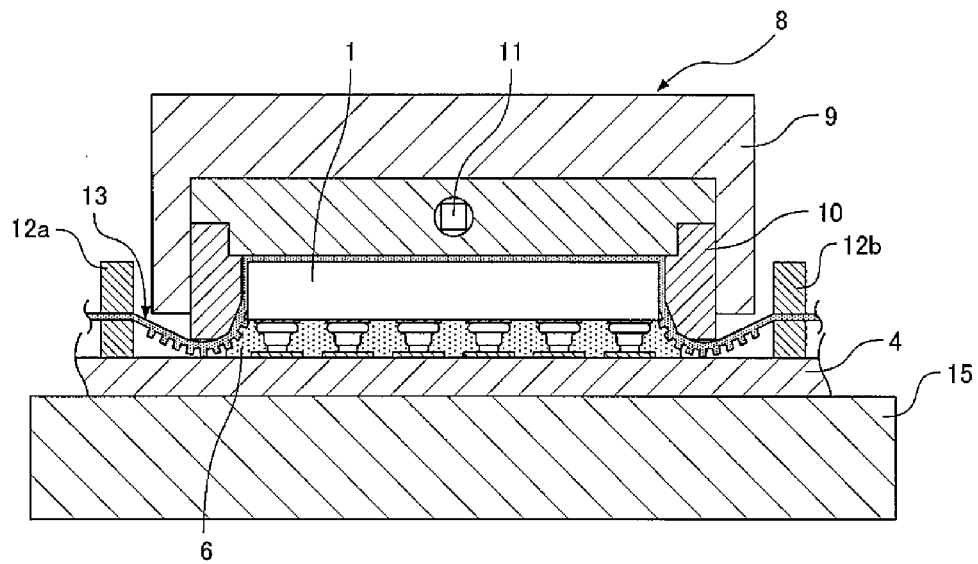
FIG. 5 is a sectional view showing the flip-chip mounting process according to the first embodiment.

Next, as shown in FIG. 5, the semiconductor chip 1 is further pressed by the pressure-bonding tool 8 to the circuit board 4 through the film 13 while being heated, and the insulating resin 6 protruding from the semiconductor chip 1 is pressed and heated by the frame 10 through the film 13.

Figure 6:
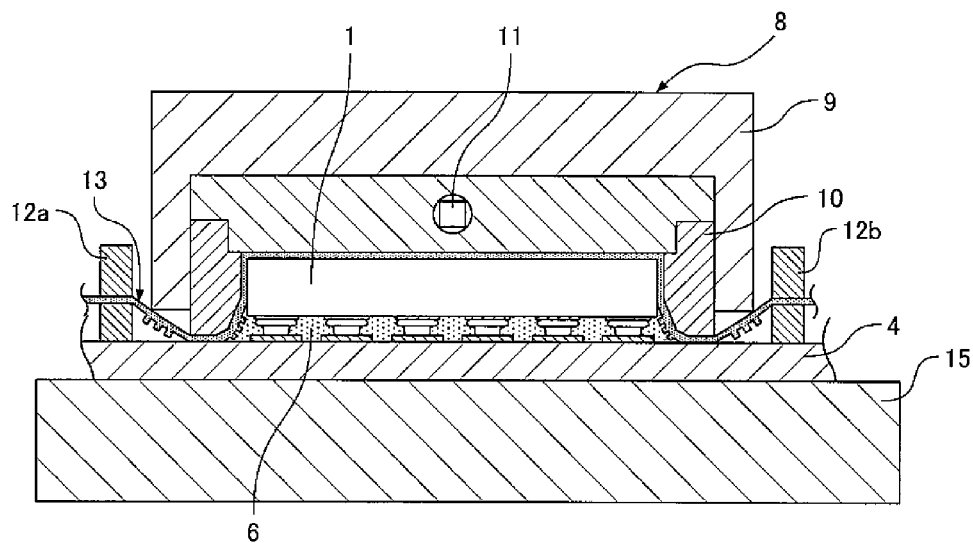
FIG. 6 is a sectional view showing the flip-chip mounting process according to the first embodiment.

Then, as shown in FIG. 6, the pressure-bonding tool 8 continues pressing the semiconductor chip 1 while gradually deforming the bumps 3 of the semiconductor chip 1. Meanwhile, the frame 10 also continues pressing the insulating resin 6 protruding from the semiconductor chip 1, through the film 13.

A load from the pressure-bonding tool 8 causes all the bumps 3 to penetrate the insulating resin 6 and deforms the bumps 3 in contact with the terminal electrodes 5 of the circuit board 4.

Figure 7:
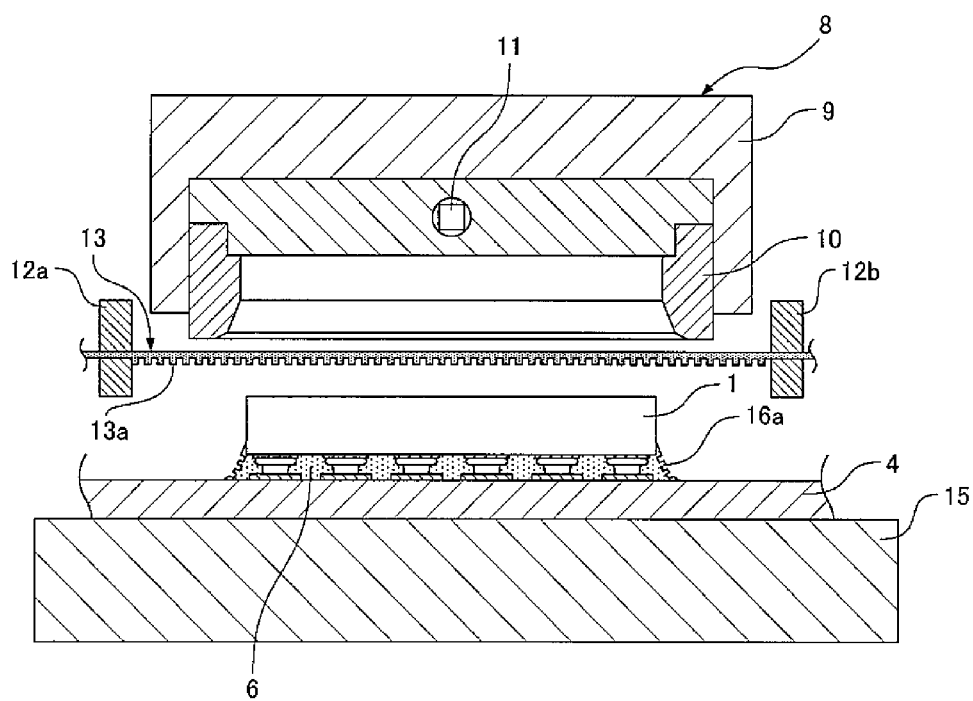
FIG. 7 is a sectional view showing the flip-chip mounting process according to the first embodiment.

Next, as shown in FIG. 7, the pressure-bonding tool 8 presses the bumps 3 of the semiconductor chip 1 to a desired height and then the insulating resin 6 is cured. Thus the unevenness pattern 13a of the film 13 is transferred to the insulating resin 6 protruding from the end of the semiconductor chip 1 and a surface unevenness (dimple part) 16a is formed on the insulating resin 6.

At this point, each of the bumps is deformed with a load of about 50 g. The load is controlled according to the size of the bump. In this case, the bumps are 25 μmt in height. Further, the occurrence of voids may be suppressed by controlling an internal pressure to the insulating resin 6 by heating or cooling the stage 15 as needed.

Finally, as shown in FIG. 7, the pressure-bonding tool 8 and the support members 12a and 12b are removed and a flip-chip mounting body is obtained. In a process shown in FIGS. 8 to 11, a container 40 is formed on the flip-chip mounting body.

Figure 8:
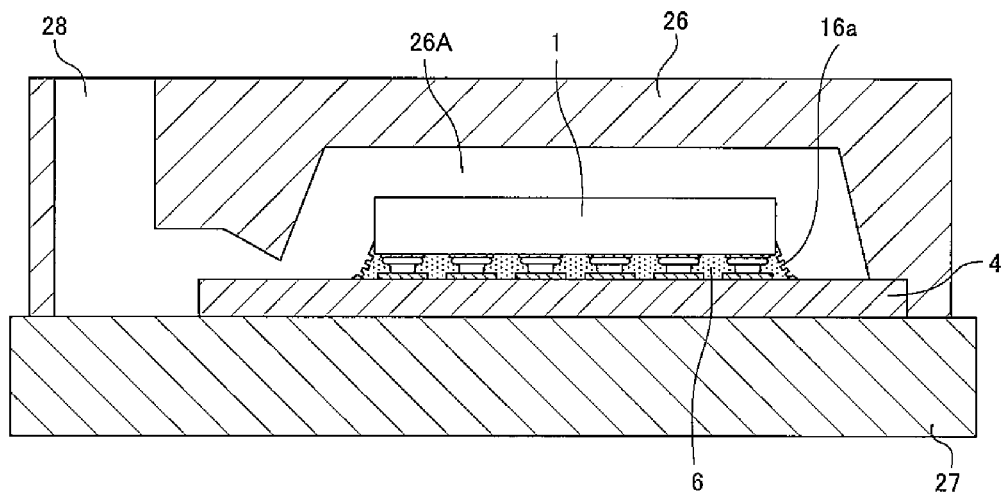
FIG. 8 is a sectional view showing the flip-chip mounting process according to the first embodiment.

In FIG. 8, the flip-chip mounting body of FIG. 7 is set at a desired position on a circuit board fixing stage 27 and a transfer mold 26 is placed over the flip-chip mounting body.

Figure 9:
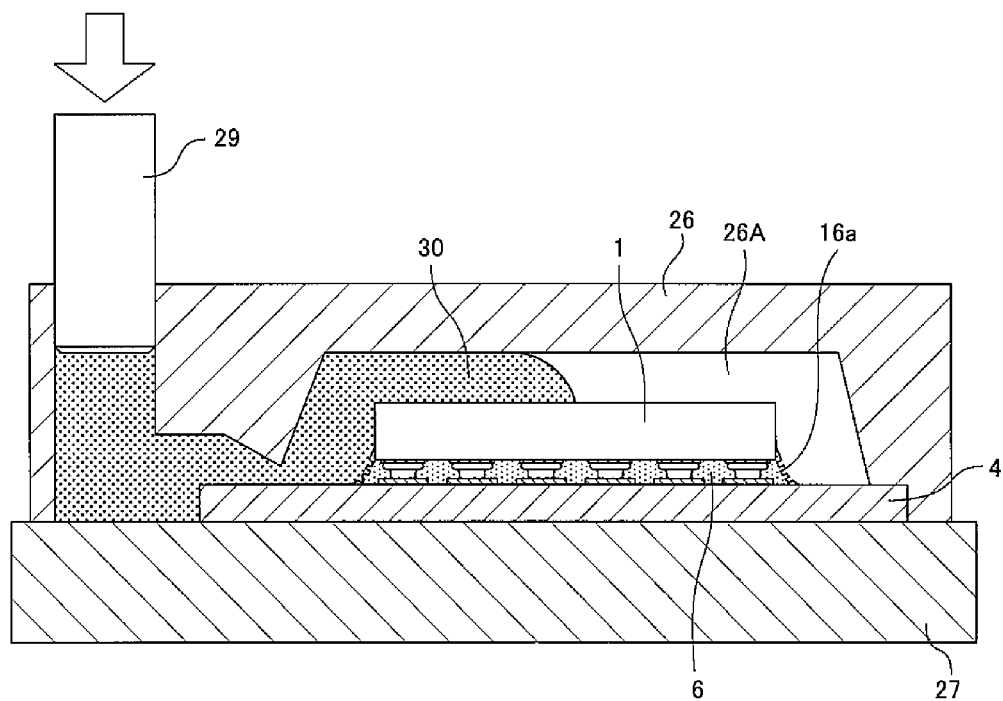
FIG. 9 is a sectional view showing the flip-chip mounting process according to the first embodiment.

Next, as shown in FIG. 9, a molding resin 30 is injected with heat from a gate 28 of the transfer mold 26 while being pressed by a pressure cylinder 29.

Figure 10:
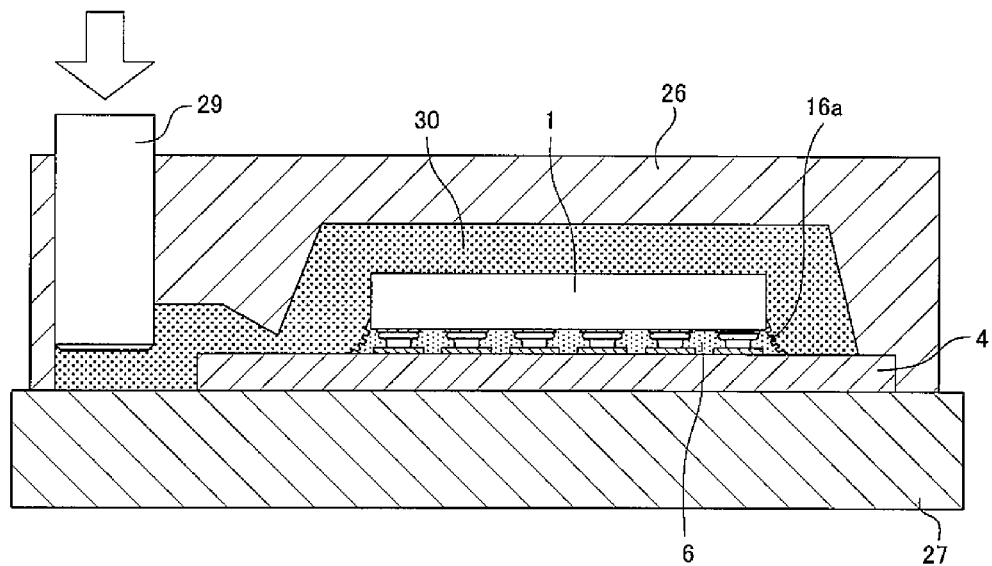
FIG. 10 is a sectional view showing the flip-chip mounting process according to the first embodiment.

And then, as shown in FIG. 10, the molding resin 30 is fully injected into a cavity 26A accommodating the semiconductor chip 1 and the surface unevenness 16a of the flip-chip mounting body.

Figure 11:
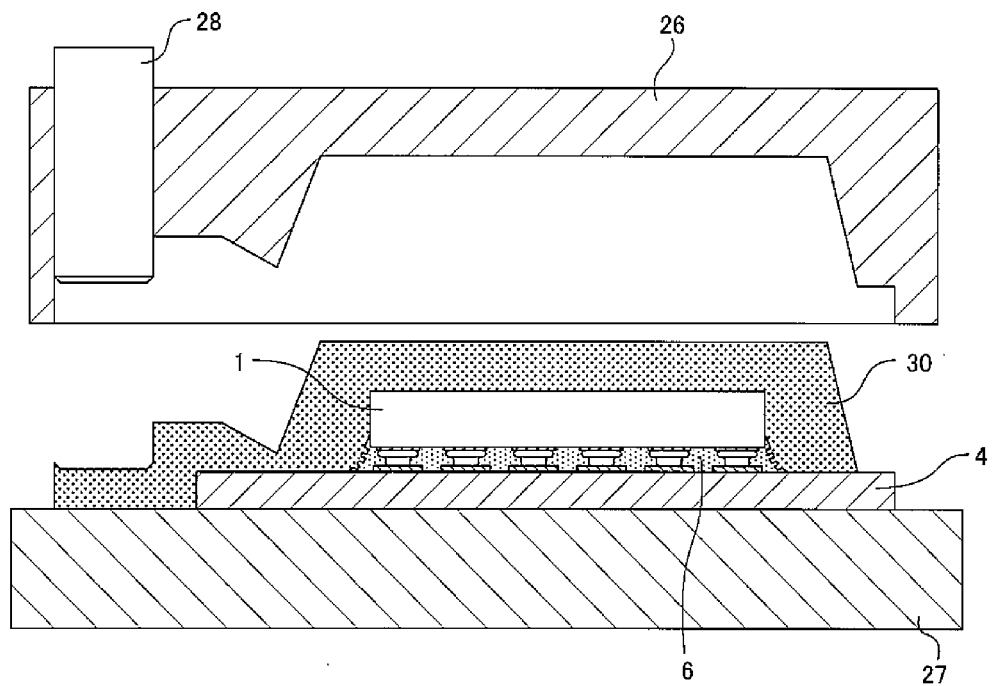
FIG. 11 is a sectional view showing the flip-chip mounting process according to the first embodiment.

Next, as shown in FIG. 11, the pressure cylinder 29 is released and the transfer mold 26 is removed.

Figure 12:
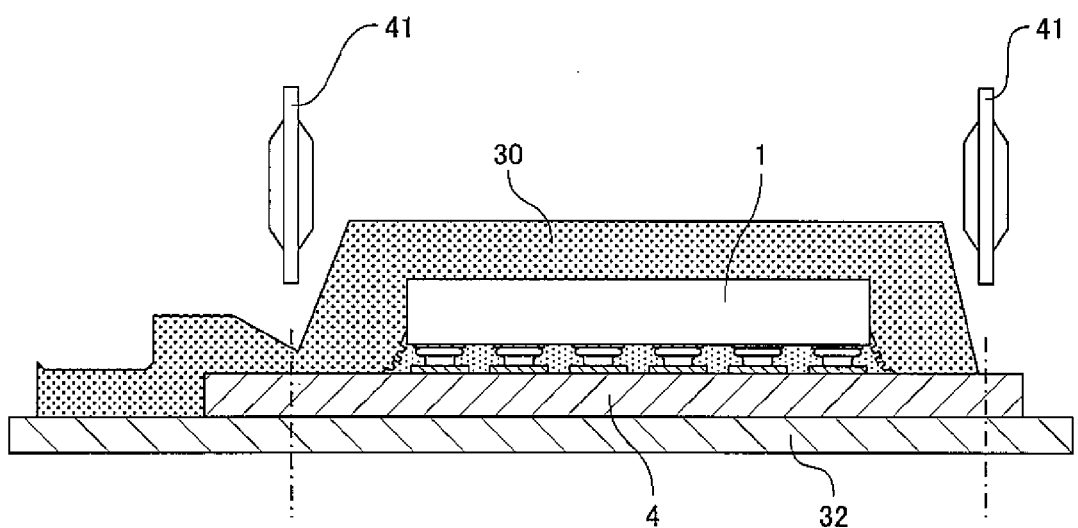
FIG. 12 is a sectional view showing the flip-chip mounting process according to the first embodiment.
Figure 13:
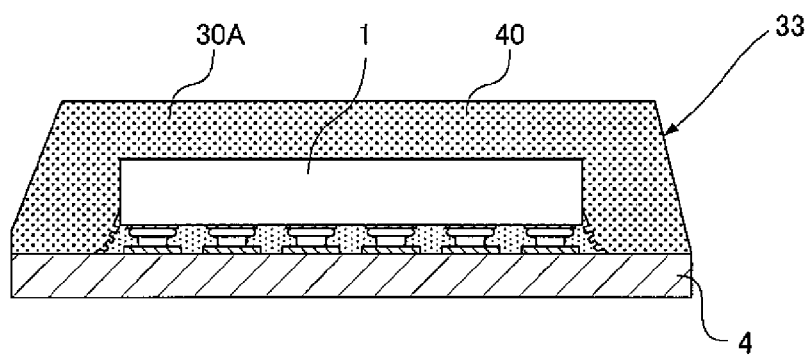
FIG. 13 is a sectional view showing a completed semiconductor device according to the first embodiment.

And then, as shown in FIG. 12, the molded flip-chip mounting body is fixed on dicing tape 32, is set on a dicing device, and is cut into a desired size with blades 41.

The molded flip-chip mounting body may be diced with a laser. In this case, the mounting body is fixed on a circuit board sucking/fixing instrument.

Finally, as shown in FIG. 13, a molded semiconductor device 33 is completed.

Figure 15:
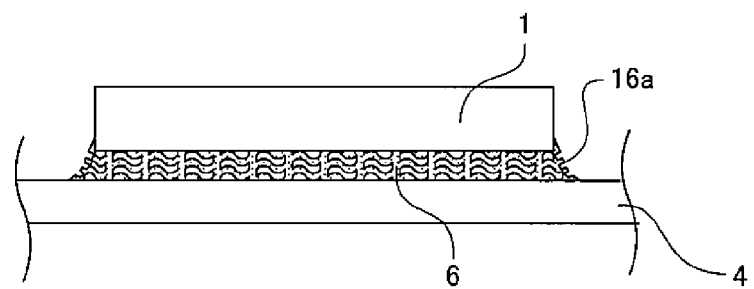
FIG. 15 is a front view showing flip-chip mounting before a container is placed according to the first embodiment.

According to the flip-chip mounting method of the first embodiment, the unevenness pattern 13a of the film 13 is transferred to the insulating resin 6, so that the surface unevenness 16a can be uniformly formed as shown in FIG. 15. Further, the inner surface of the molded container 40 is joined into the surface unevenness 16a of the insulating resin 6 with a large contact surface. Thus a bonding strength to the container 40 can be increased by an anchor effect.

The insulating resin 6 is pressure-molded and cured by the pressure-bonding tool 8 through the film 13, thereby suppressing the occurrence of voids. By joining the container 40, the semiconductor device becomes so reliable that moisture hardly enters an electrical connection point between the circuit board 4 and the semiconductor chip 1 in a hot and humid environment.

Since the amount of moisture absorbed into the insulating resin 6 is small, the insulating resin 6 is hardly expanded by heated moisture during reflow, thereby considerably reducing exfoliation on the interface between the container 40 and the insulating resin 6. It is further possible to reduce a tensile stress applied between the bumps 3 of the semiconductor chip 1 and the terminal electrodes 5, improving the reliability of electrical connection.

In the first embodiment, the temperature of the pressure-bonding tool 8 is set at 210° C. to transfer heat to the semiconductor chip 1 through the film 13 and cure the insulating resin 6 at 180° C.

In the present embodiment, the pressure-bonding tool 8 is controlled at a constant temperature. The pressure-bonding tool 8 may be a ceramic high-speed temperature rising type that controls a temperature increase based on a temperature profile.

Second Embodiment

Figure 16:
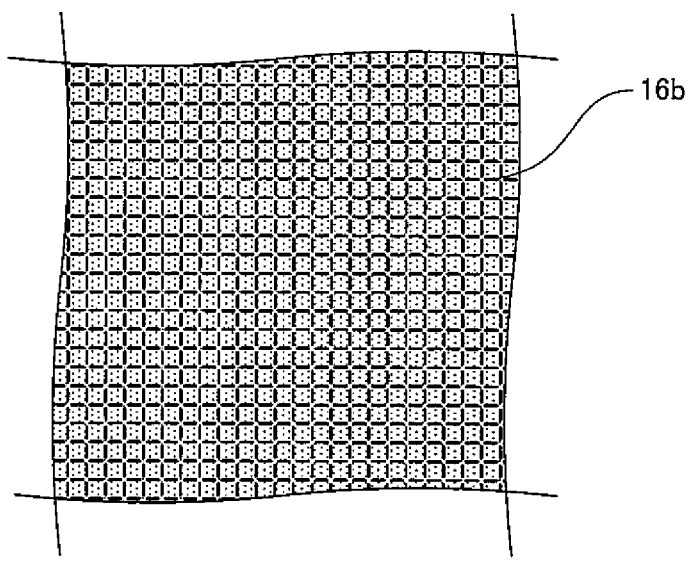
FIG. 16 is a plan view showing a film according to a second embodiment of the present invention.
Figure 17:
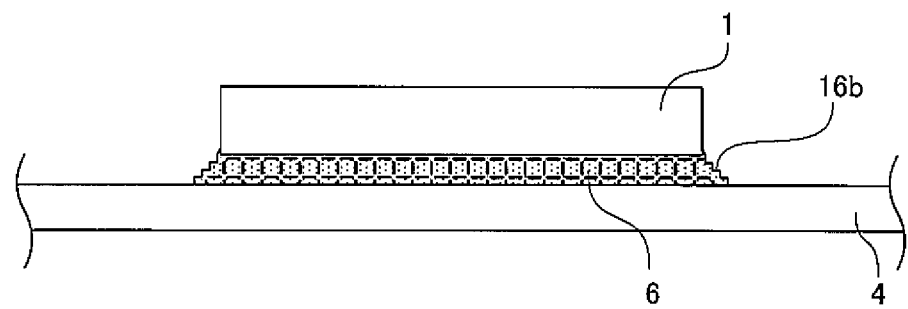
FIG. 17 is a front view showing flip-chip mounting before a container is placed according to the second embodiment.

FIGS. 16 and 17 show a second embodiment.

In the first embodiment, the wavy unevenness pattern 13a of FIG. 14 is formed on the surface of the film 13 so as to face the semiconductor chip 1. The second embodiment is different only in that a wavy unevenness pattern 13b of FIG. 16 is formed on the surface of a film 13 so as to face a semiconductor chip 1. To be specific, a mesh unevenness pattern is formed as a periodically repeating pattern while being pressed and heated by a roller during the fabrication of the film 13. FIG. 17 shows a surface unevenness (dimple part) 16b formed on the fillet of an insulating resin 6. Other configurations are similar to those of the first embodiment.

Third Embodiment

Figure 18:
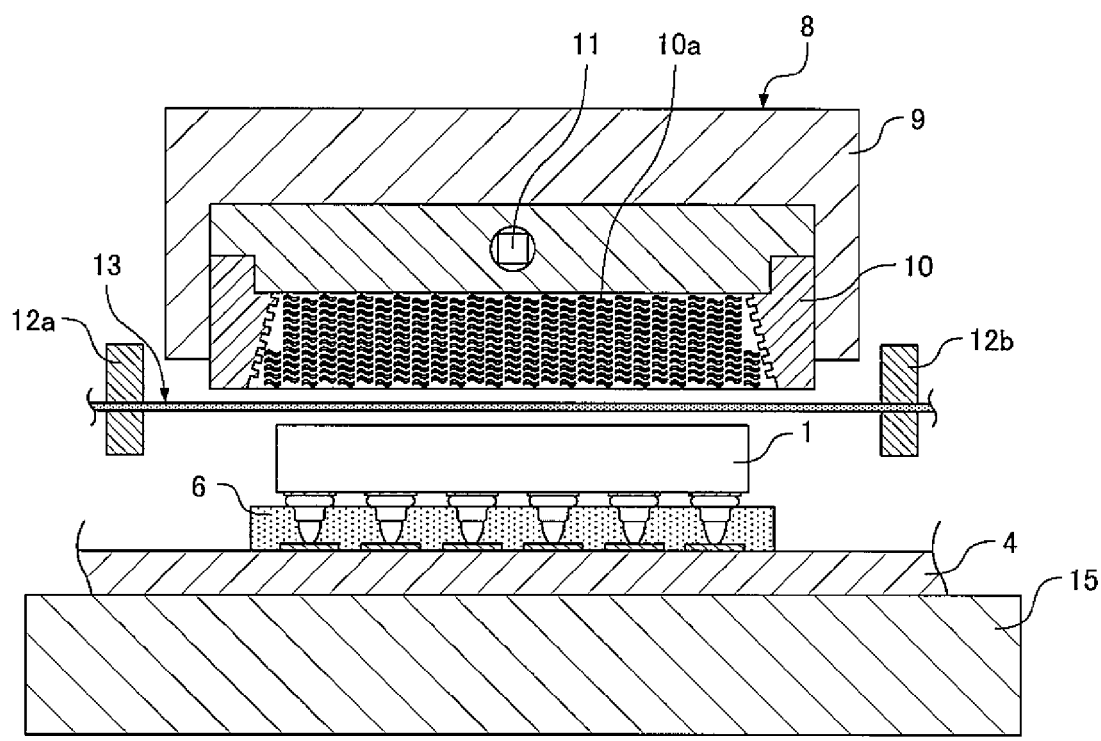
FIG. 18 is a sectional view showing a flip-chip mounting apparatus according to a third embodiment of the present invention.

FIG. 18 shows a third embodiment.

In the first and second embodiments, the unevenness pattern 13a or 13b is formed on the film 13 and is transferred to form the surface unevenness (dimple part) 16a or 16b on the fillet of the insulating resin 6. The third embodiment is different only in that a surface unevenness 10a is formed on the surface of a frame 10 of a pressure-bonding tool 8 and the surface unevenness 10a on the surface of the frame 10 is transferred to the fillet of an insulating resin 6 to form a surface unevenness on the fillet. The finished shape is identical to that of FIG. 13. In the third embodiment, an unevenness pattern 13a facing a semiconductor chip 1 is not formed on a surface of a film 13 and thus the film 13 has flat surfaces.

In the present embodiment, since the surface unevenness 10a is formed on the pressure-bonding tool 8, the frame 10 can be easily replaced with another to change a transferred shape and the processing cost of the film can be reduced as compared with the first and second embodiments in which the unevenness pattern on the film 13 is transferred.

Fourth Embodiment

Figure 19:
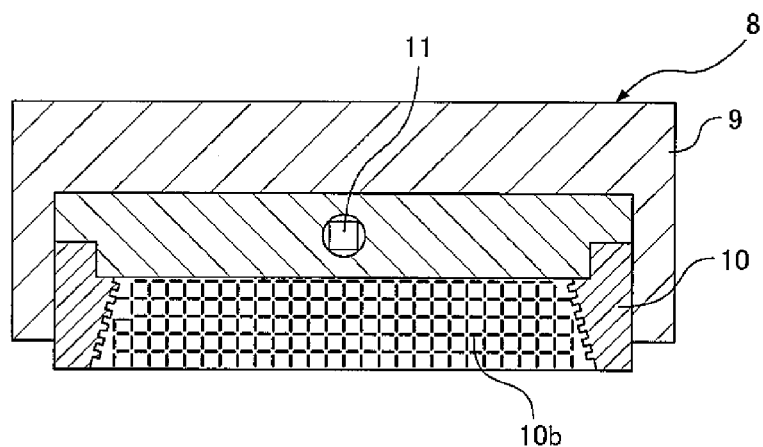
FIG. 19 is a sectional view showing a pressure-bonding tool 8 used in a flip-chip mounting apparatus according to a fourth embodiment of the present invention.

FIG. 19 shows a pressure-bonding tool 8 used in a fourth embodiment.

In the third embodiment, the wavy surface unevenness is formed on the surface of the frame 10. FIG. 19 is different from the third embodiment only in that a surface unevenness 10b in a mesh pattern is formed. The finished shape is identical to that of FIG. 13. A surface unevenness (dimple part) 16b formed on the fillet of an insulating resin 6 is identical to that of FIG. 17. A film 13 has flat surfaces and an unevenness pattern 13a facing a semiconductor chip 1 is not formed on a surface of the film 13.

Fifth Embodiment

Figure 20:
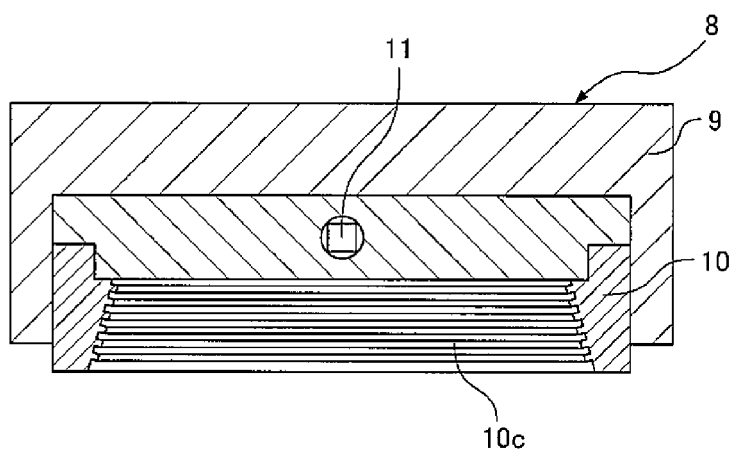
FIG. 20 is a sectional view showing a pressure-bonding tool 8 used in a flip-chip mounting apparatus according to a fifth embodiment of the present invention.

FIG. 20 shows a pressure-bonding tool 8 used in a fifth embodiment.

In FIG. 20, a surface unevenness 10c in a stepped pattern is formed as a periodically repeating pattern on the surface of a frame 10. The surface unevenness 10c includes steps that are 0.5 mm in width on one side and are 0.5 mm in height. Other configurations are identical to those of the fourth embodiment. An unevenness pattern 13a facing a semiconductor chip 1 is not formed on a surface of a film 13 and thus the film 13 has flat surfaces.

Sixth Embodiment

Figure 21:
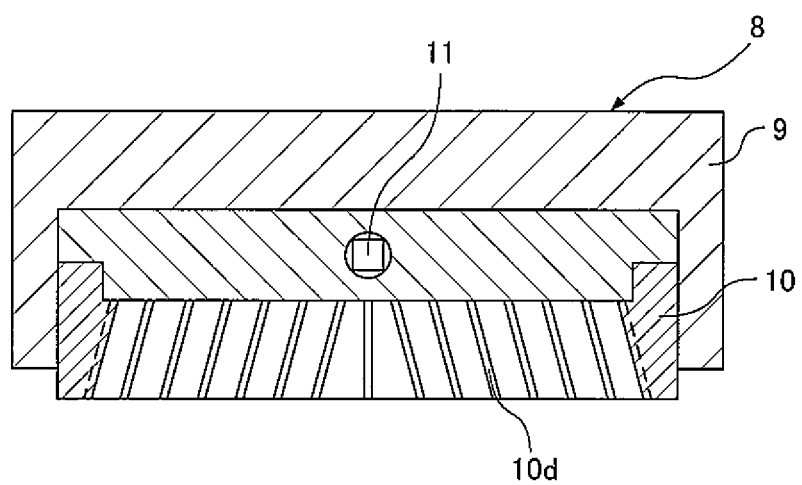
FIG. 21 is a sectional view showing a pressure-bonding tool 8 used in a flip-chip mounting apparatus according to a sixth embodiment of the present invention.
Figure 22:
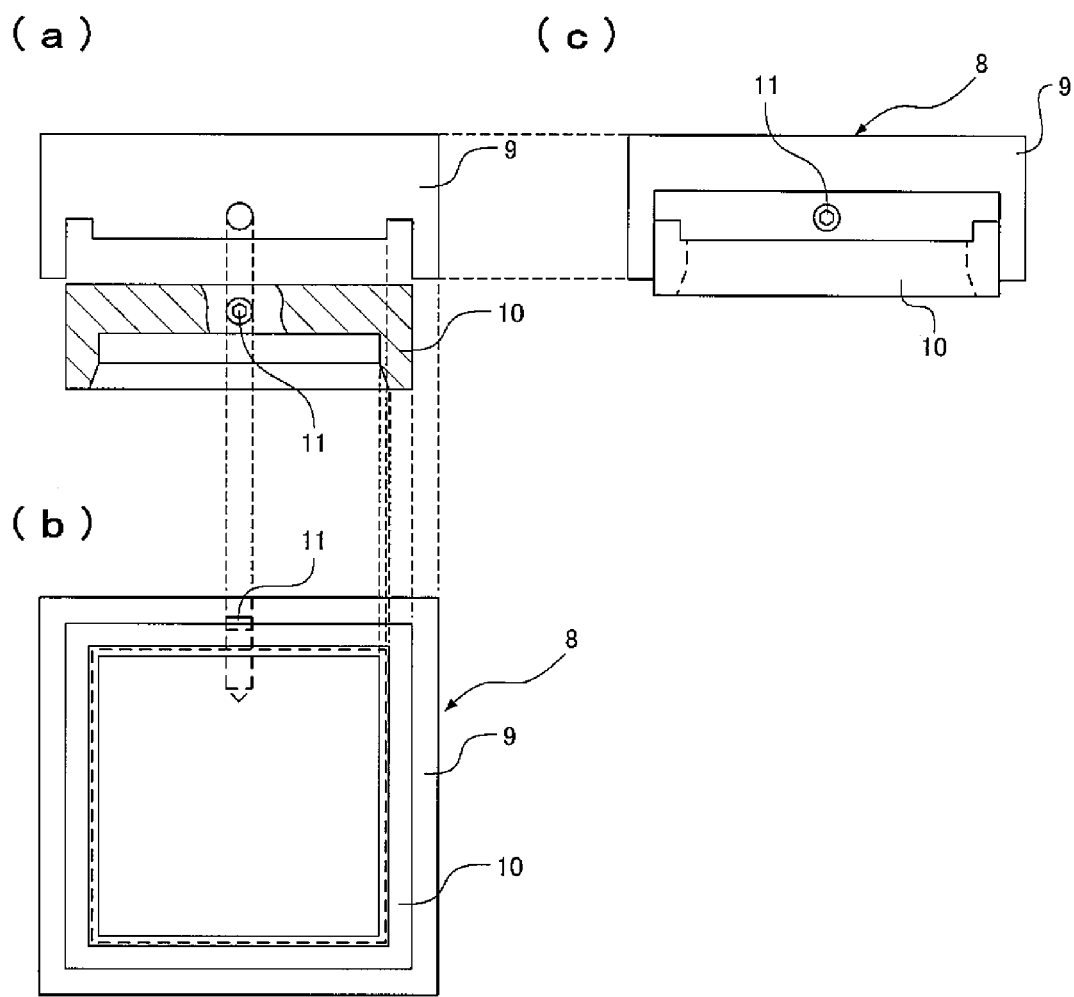
FIG. 22 shows an exploded view, an assembly drawing, and a bottom view of a pressure-bonding tool 8 used in a flip-chip mounting process according to an eighth embodiment of the present invention.

FIG. 21 shows a pressure-bonding tool 8 used in a sixth embodiment.

The sixth embodiment is different from the fifth embodiment only in that a stepped pattern on the surface of a frame 10 is formed in the circumferential direction. To be specific, a surface unevenness 10d including slide-like patterns is formed in a stepped pattern as a periodically repeating pattern, in which an upper step is 0.5 mm in width on one side and a step is 0.5 mm in height.

The surface unevenness of the pressure-bonding tool 8 is elastically deformed when pressing an insulating resin 6 protruding around a semiconductor chip 1. Thus the interval of the surface unevenness may be 0.5 mm or larger in a pressing direction. Further, the recessed portion of the slide pattern may be larger in width and smaller in depth toward the lower part of the frame 10. Other configurations are identical to those of the fifth embodiment.

Seventh Embodiment

In the surface unevenness formed on the fillet of the insulating resin 6 in FIG. 20 of the fifth embodiment, grooves extending in parallel with a circuit board 4 are vertically stacked at regular intervals and the upper and lower grooves are not connected to each other. On the surface of a frame 10, at least one spiral projecting portion may be formed so as to extend from the opening of the lower end of the frame 10 to the rear of the frame 10 and the projecting shape may be transferred to the fillet of an insulating resin 6.

To be specific, the groove of the spiral shape is 0.5 mm in depth (length) and the spiral patterns are formed at intervals of 0.5 mm.

The surface unevenness of a pressure-bonding tool 8 is elastically deformed when pressing the insulating resin 6 protruding around a semiconductor chip 1. Thus the spiral grooves may be spaced at 0.5 mm or larger in a pressing direction. Other configurations are similar to those of the fifth embodiment.

Eighth Embodiment

FIGS. 23 to 34 show a flip-chip mounting process. FIG. 35 shows a completed semiconductor device.

A semiconductor chip 1 is set on a circuit board 4 as in FIGS. 1(a) and 1(b).

The subsequent process will be discussed below.

Figure 26:
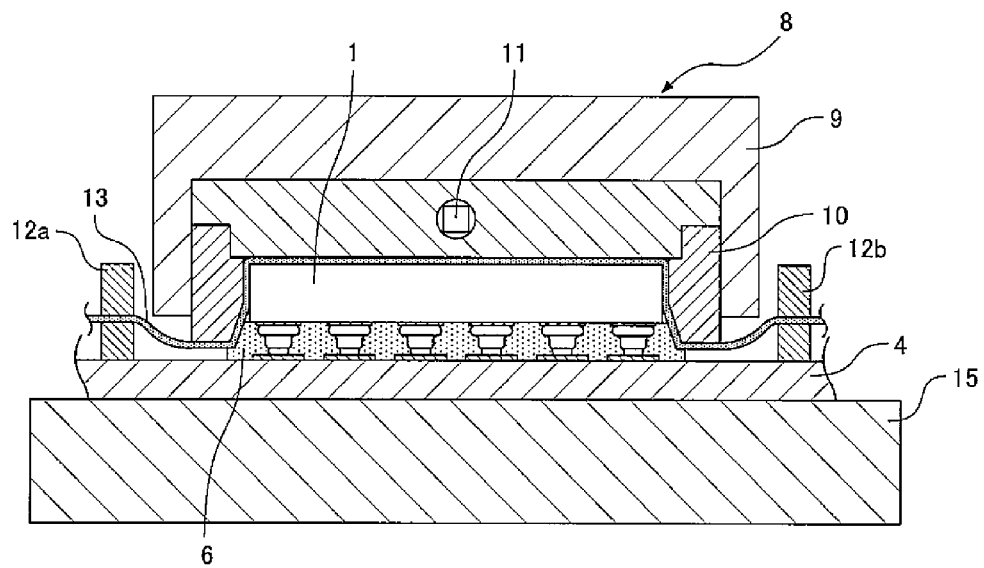
FIG. 26 is a sectional view showing the upstream process of the flip-chip mounting process according to the eighth embodiment.

In the subsequent process, a film 13 is pressed as shown in FIG. 26 onto the semiconductor chip 1 mounted as in FIG. 1(b), by using a pressure-bonding tool 8 of FIG. 22(c). Thus the fillet of an insulating resin 6 is molded.

As shown in FIGS. 22(a) and 22(b), the pressure-bonding tool 8 is made up of a pressing part 9 and a frame 10 that is attached to the underside of the pressing part 9 with a screw 11 in a replaceable manner. The frame 10 may be made of materials such as a thermosetting epoxy resin, a phenol resin, a polyimide, a silicone, a fluorocarbon resin, and a rubber resin, or a mixture of the insulating thermosetting resins and the insulating thermoplastic resins.

Figure 23:
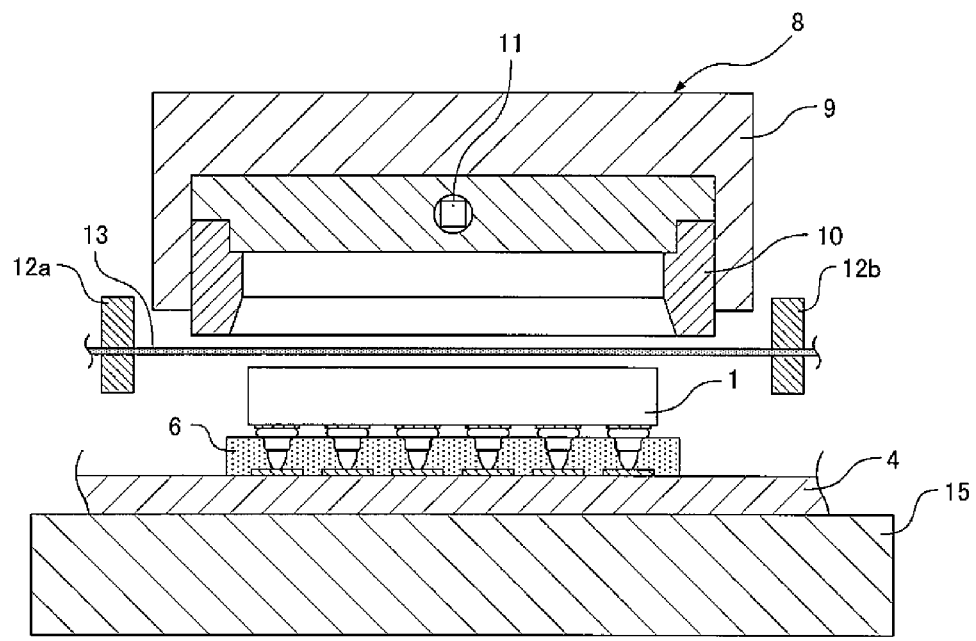
FIG. 23 is a sectional view showing the upstream process of the flip-chip mounting process according to the eighth embodiment.

As shown in FIG. 23, the film 13 stretched between support members 12a and 12b is provided between the pressure-bonding tool 8 and a stage 15, and the semiconductor chip 1 mounted as in FIG. 1(b) is set on the stage 15 provided below the film 13. The film 13 is larger in size than the semiconductor chip 1 in the vertical and horizontal directions. The film 13 is desirably resistant to heat (NCF curing temperature). The film 13 is preferably made of materials such as a polyimide, polyphenylene sulfide, a fluorocarbon resin, and a silicone rubber, or is preferably a heat-resistant thermoplastic film having a two-layer structure or the like. In this configuration, the film 13 was about 20 μm to 30 μm in thickness. The film 13 has flat surfaces and any particular patterns are not formed thereon.

Figure 24:
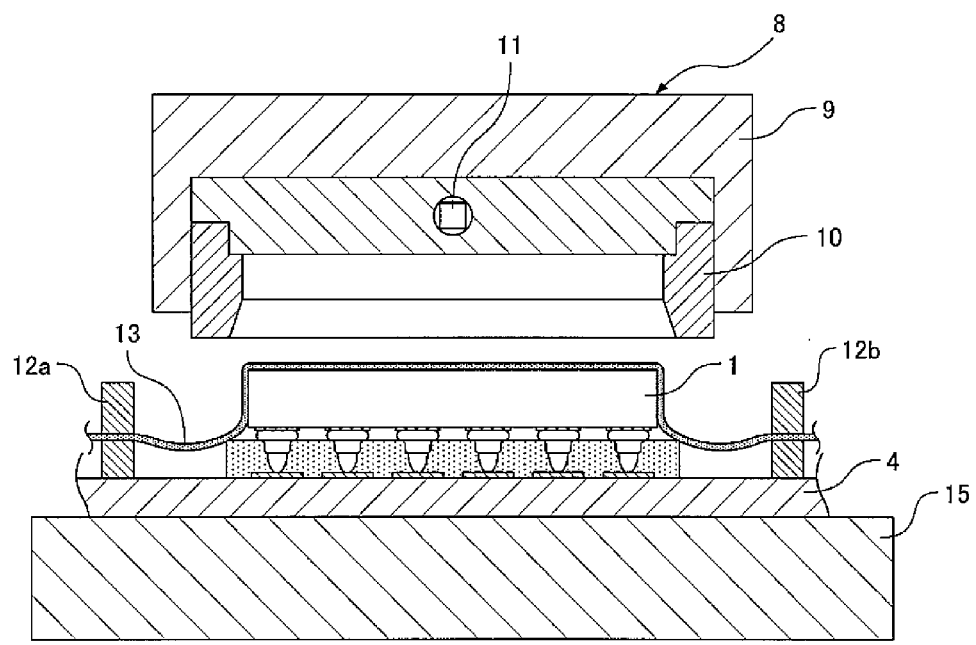
FIG. 24 is a sectional view showing the upstream process of the flip-chip mounting process according to the eighth embodiment.

In FIG. 24, the support members 12a and 12b are moved down toward the stage 15 and brought into contact with the circuit board 4, and then the support members 12a and 12b loosen the tension of the film 13, so that the film 13 is placed substantially on the semiconductor chip 1 and the insulating resin 6 bonded so as to protrude around the semiconductor chip 1.

Figure 25:
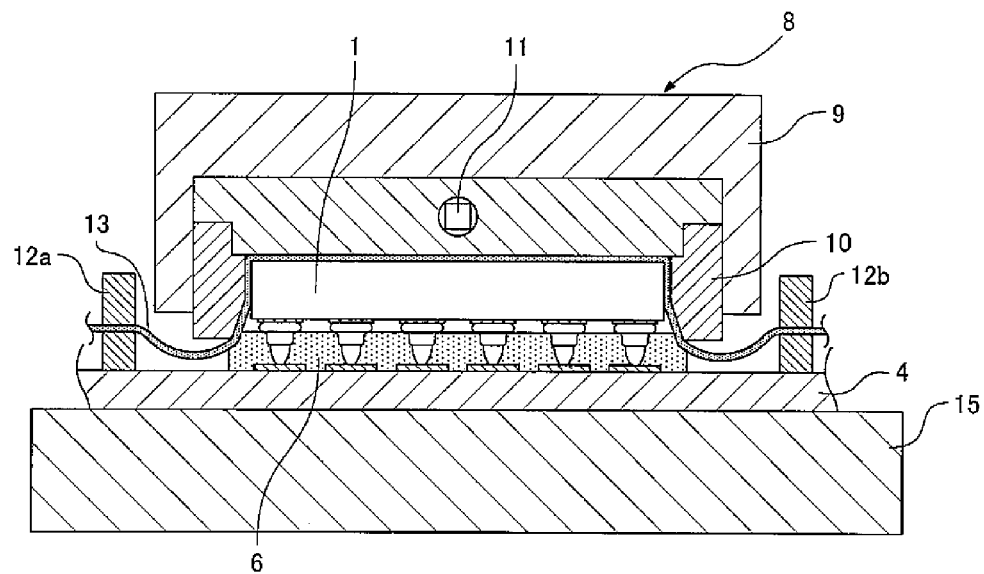
FIG. 25 is a sectional view showing the upstream process of the flip-chip mounting process according to the eighth embodiment.

In FIG. 25, the pressure-bonding tool 8 is further moved down toward the stage 15 to cover the semiconductor chip 1 with the frame 10, and the top surface of the semiconductor chip 1 and the fillet of the insulating resin 6 are pressed while being heated through the film 13.

The film 13 may be guided onto the insulating resin 6 by suction or the like from the circuit board 4 or the stage 15.

Next, as shown in FIG. 26, the semiconductor chip 1 is further pressed by the pressure-bonding tool 8 to the circuit board 4 through the film 13 while being heated, and the insulating resin 6 protruding from the semiconductor chip 1 is pressed and heated by the frame 10 through the film 13.

Figure 27:
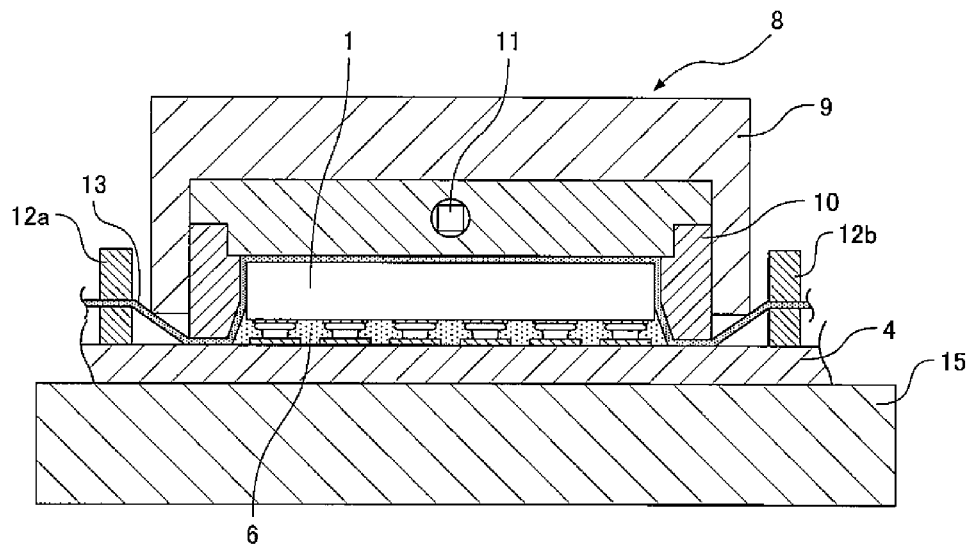
FIG. 27 is a sectional view showing the upstream process of the flip-chip mounting process according to the eighth embodiment.

Then, as shown in FIG. 27, the pressure-bonding tool 8 continues pressing the semiconductor chip 1 while gradually deforming bumps 3 of the semiconductor chip 1. Meanwhile, the frame 10 also continues pressing the insulating resin 6 protruding from the semiconductor chip 1, through the film 13. A load from the pressure-bonding tool 8 causes all the bumps 3 to penetrate the insulating resin 6 and deforms the bumps 3 in contact with terminal electrodes 5 of the circuit board 4.

The pressure-bonding tool 8 presses the bumps 3 of the semiconductor chip 1 to a desired height and then the insulating resin 6 is cured. Thus as shown in FIG. 28, the flat surface shape of the film 13 is transferred to the insulating resin 6 protruding from the end of the semiconductor chip 1.

At this point, each of the bumps is deformed with a load of about 50 g. The load is controlled according to the size of the bump 3. In this case, the bumps are 25 μmt in height. Further, the occurrence of voids may be suppressed by controlling an internal pressure to the insulating resin 6 by heating or cooling the stage 15 as needed.

Then, the pressure-bonding tool 8 and the support members 12a and 12b are removed, so that a flip-chip mounting body is obtained.

Figure 28:
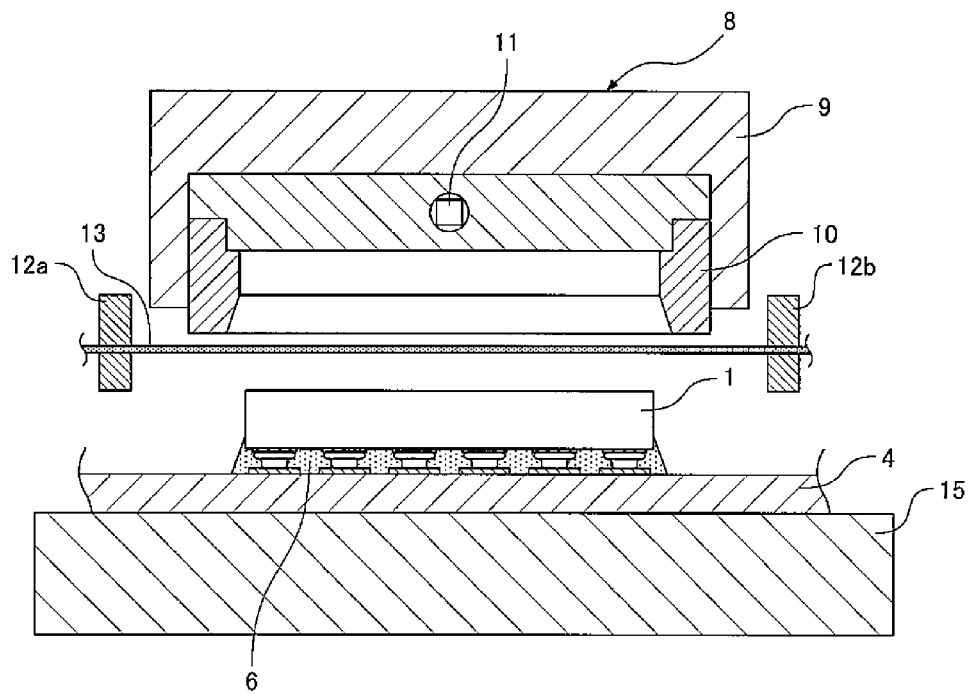
FIG. 28 is a sectional view showing the upstream process of the flip-chip mounting process according to the eighth embodiment.

Next, as shown in FIGS. 29(a) and 29(b), an unevenness layer 16 is formed and cured on a fillet 6a of the insulating resin 6 in the flip-chip mounting body of FIG. 28.

To be specific, as shown in FIGS. 29(a) and 29(b), a second resin 162 is applied in a mesh pattern by using a dispenser 161 to at least a part of the fillet 6a of an underfill resin protruding from the semiconductor chip. When the second resin 162 has high thixotropy, dripping is prevented and an unevenness pattern is not deformed, thereby preventing a reduction in the adhesion with a molding resin. The second resin 162 was an epoxy resin of 700 Pa·s. The second resin 162 may be a conductive resin.

In this case, the second resin 162 is applied in a mesh pattern to the fillet 6a protruding from the semiconductor chip. The second resin 162 may be applied in any patterns such as wavy and spiral patterns as long as a bonding area is expanded between the underfill resin and the molding resin and the bonding strength increases.

In the process of FIGS. 30 to 34, a container 40 is formed on the flip-chip mounting body in which the unevenness layer 16 is formed on the fillet 6a.

Figure 29:
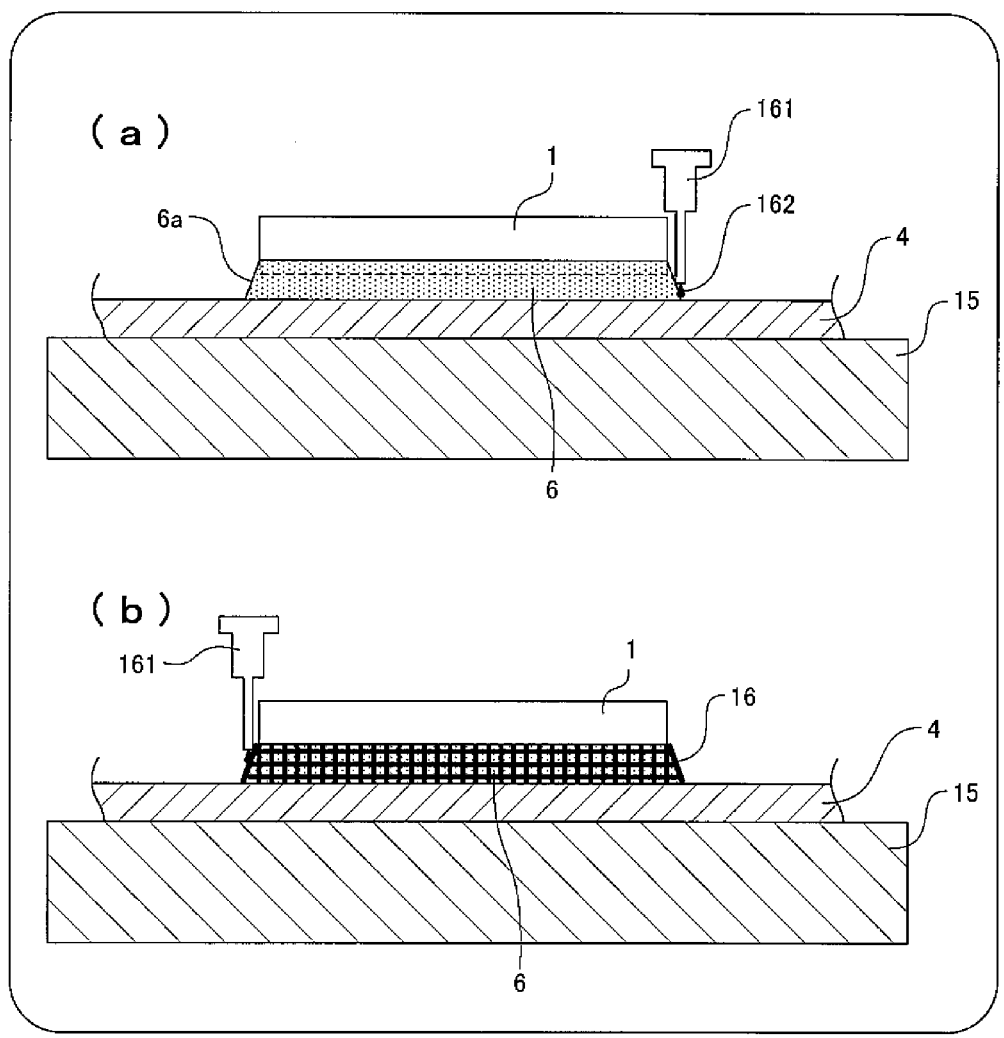
FIG. 29 is an explanatory drawing showing a process of forming an unevenness layer 16 on the fillet of a semiconductor chip formed in the upstream process according to the eighth embodiment.
Figure 30:
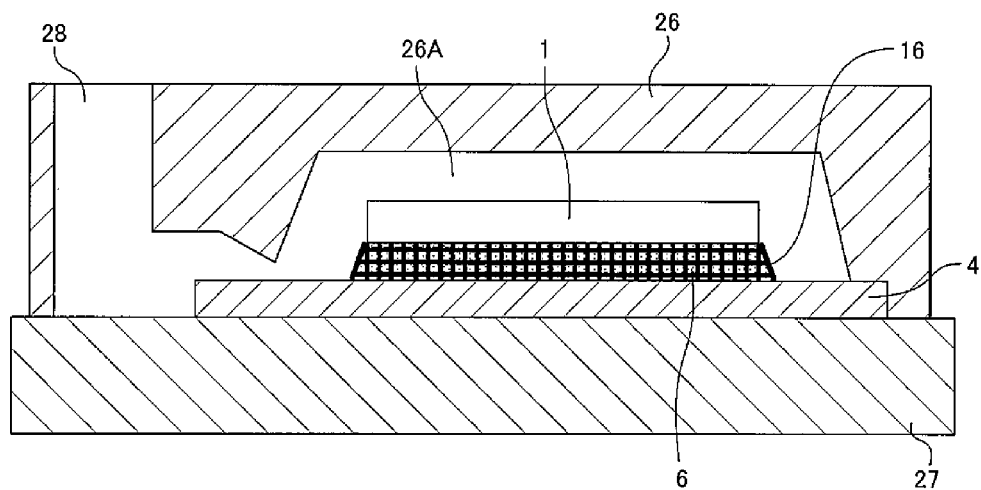
FIG. 30 is a sectional view showing the downstream process of the flip-chip mounting process according to the eighth embodiment.

In FIG. 30, the flip-chip mounting body of FIG. 29 is set at a desired position on a circuit board fixing stage 27 and a transfer mold 26 is placed over the flip-chip mounting body.

Figure 31:
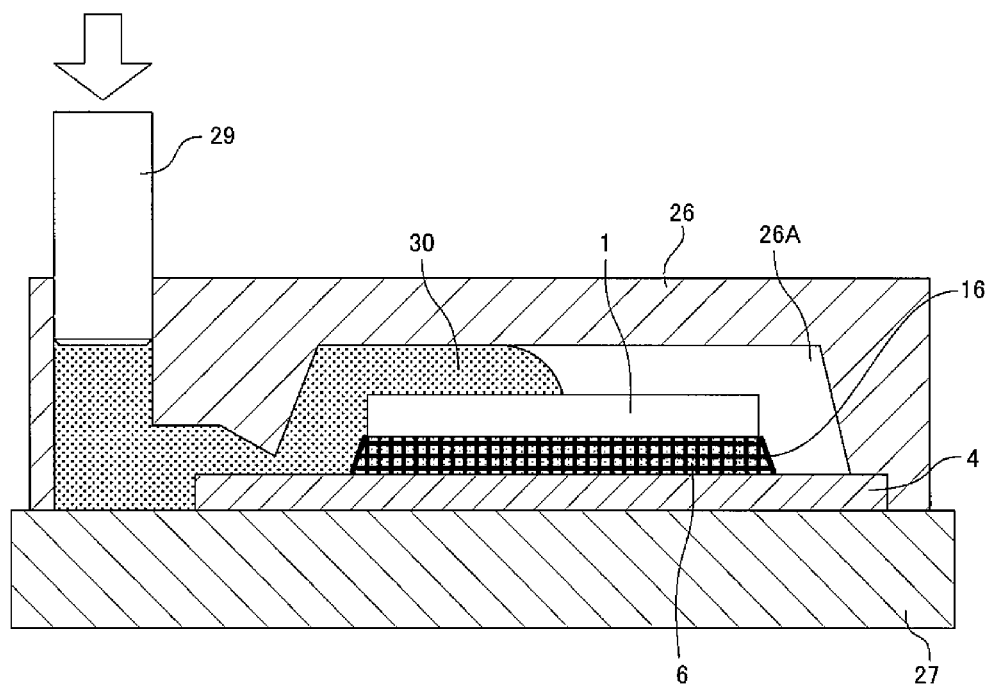
FIG. 31 is a sectional view showing the downstream process of the flip-chip mounting process according to the eighth embodiment.

Next, as shown in FIG. 31, a molding resin 30 is injected with heat from a gate 28 of the transfer mold 26 while being pressed by a pressure cylinder 29.

Figure 32:
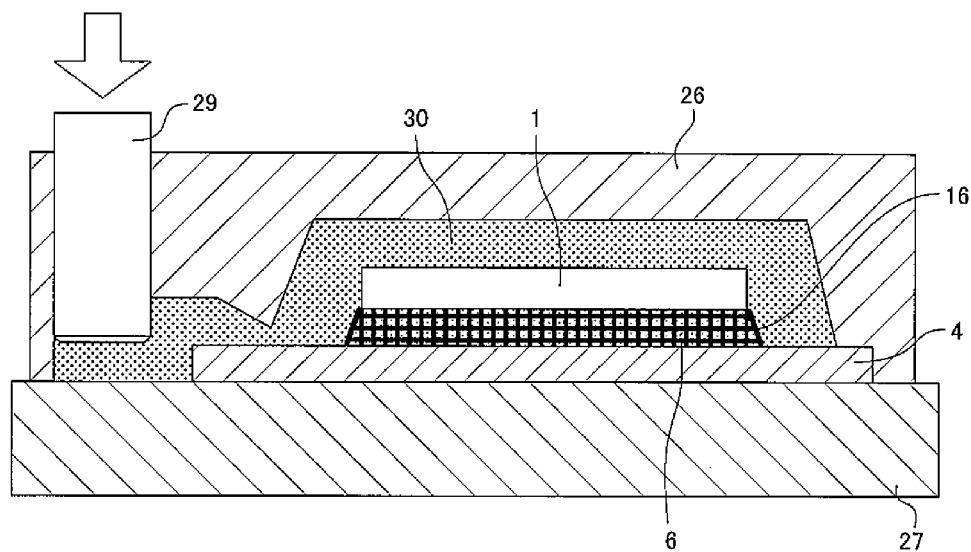
FIG. 32 is a sectional view showing the downstream process of the flip-chip mounting process according to the eighth embodiment.

Then, as shown in FIG. 32, the molding resin 30 is fully injected into a cavity 26A accommodating the semiconductor chip 1 and the unevenness layer 16 of the flip-chip mounting body.

Figure 33:
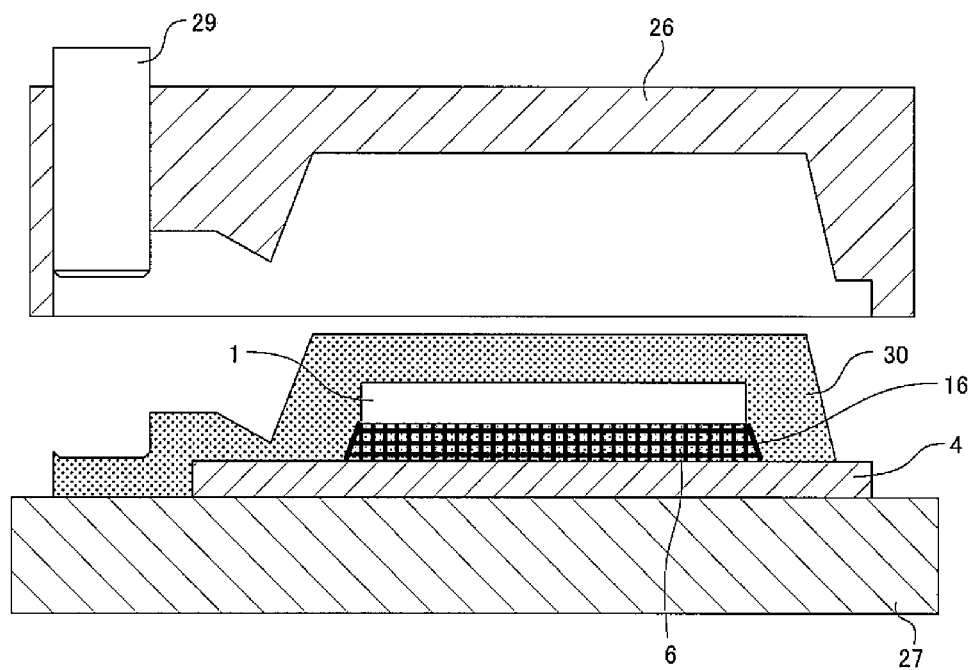
FIG. 33 is a sectional view showing the downstream process of the flip-chip mounting process according to the eighth embodiment.

Next, as shown in FIG. 33, the pressure cylinder 29 is released and the transfer mold 26 is removed.

Figure 34:
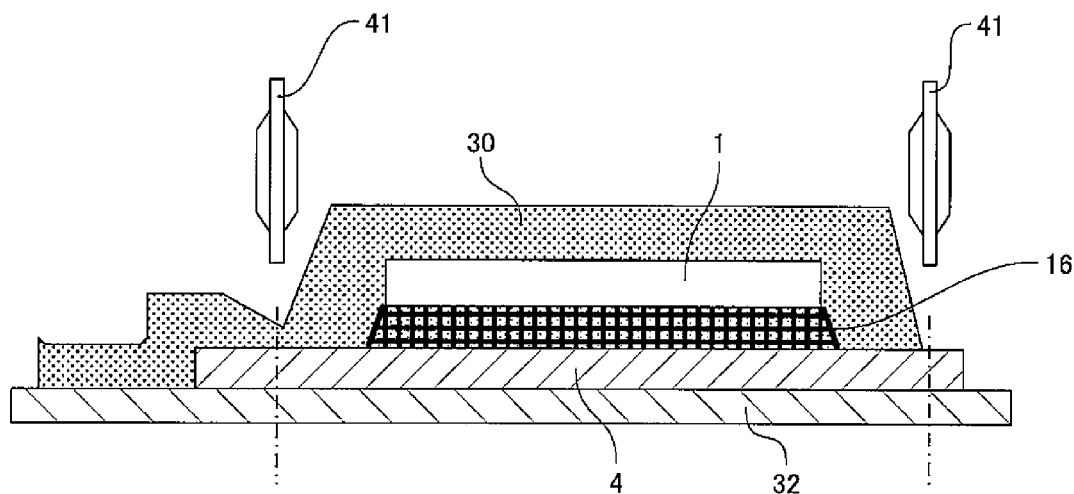
FIG. 34 is a sectional view showing the downstream process of the flip-chip mounting process according to the eighth embodiment.
Figure 35:
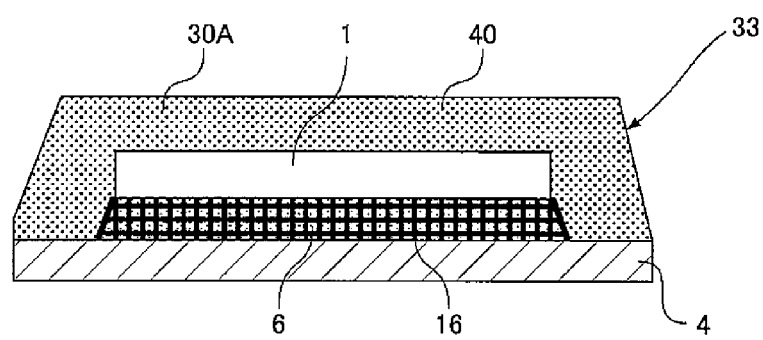
FIG. 35 is a sectional view showing a completed semiconductor device according to the eighth embodiment.

Then, as shown in FIG. 34, the molded flip-chip mounting body is fixed on dicing tape 32, is set on a dicing device, and is cut into a desired size with blades 41, so that a molded semiconductor device 33 is completed as shown in FIG. 35.

The molded flip-chip mounting body may be diced with a laser. In this case, the mounting body is fixed on a circuit board sucking/fixing instrument.

According to the flip-chip mounting method of the present embodiment, the underfill and molding resins are bonded to each other via the uniform unevenness layer 16 with a large contact area. Thus a bonding strength to the container 40 can be increased by an anchor effect.

The insulating resin 6 is pressure-molded and cured by the pressure-bonding tool 8 through the film 13, thereby suppressing the occurrence of voids. By joining the container 40, the semiconductor device becomes so reliable that moisture hardly enters an electrical connection point between the circuit board 4 and the semiconductor chip 1 in a hot and humid environment.

Since the amount of moisture absorbed into the insulating resin 6 is small, the insulating resin 6 is hardly expanded by heated moisture during reflow, thereby considerably reducing exfoliation on the interface between the container 40 and the insulating resin 6. It is therefore possible to reduce a tensile stress applied between the bumps 3 of the semiconductor chip 1 and the terminal electrodes 5, improving the reliability of electrical connection.

In the present embodiment, the temperature of the pressure-bonding tool 8 is set at 210° C. to transfer heat to the semiconductor chip 1 through the film 13 and cure the insulating resin 6 at 180° C.

Figure 36:
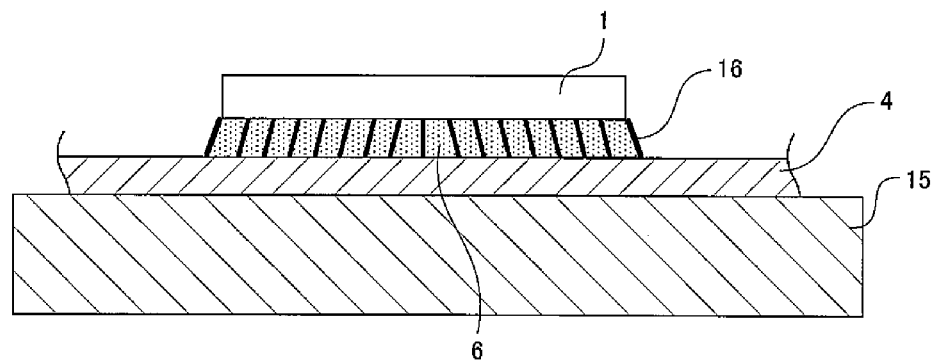
FIG. 36 is an explanatory drawing showing an unevenness layer 16 formed by longitudinally applying a second resin 162 at predetermined intervals.

In this example, as shown in FIG. 29(b), the second resin 162 is formed in a mesh pattern on the fillet. As shown in FIG. 36, the unevenness layer 16 may be formed by longitudinally applying the second resin 162 like slides at predetermined intervals. The width of application may be constant or may decrease from the upper part toward to the lower part of the unevenness layer 16.

Figure 37:
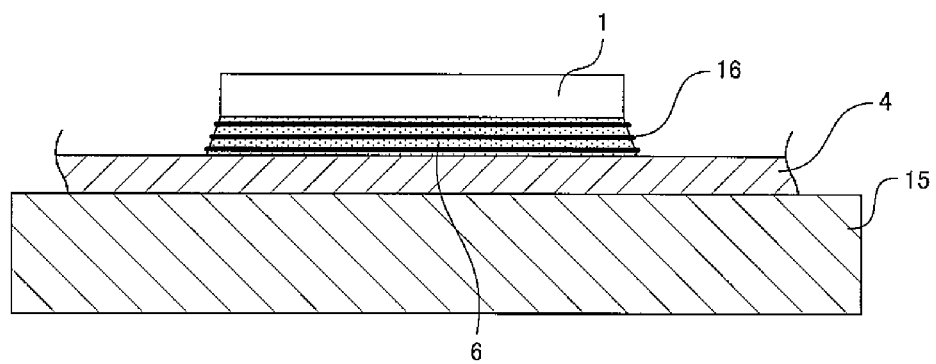
FIG. 37 is an explanatory drawing showing the unevenness layer 16 formed by laterally applying the second resin 162 like rings.

In this example, the second resin 162 is formed in a mesh pattern or is longitudinally formed like slides at predetermined intervals on the fillet. As shown in FIG. 37, the unevenness layer 16 may be formed by laterally applying the second resin 162 like rings at predetermined intervals.

Figure 38:
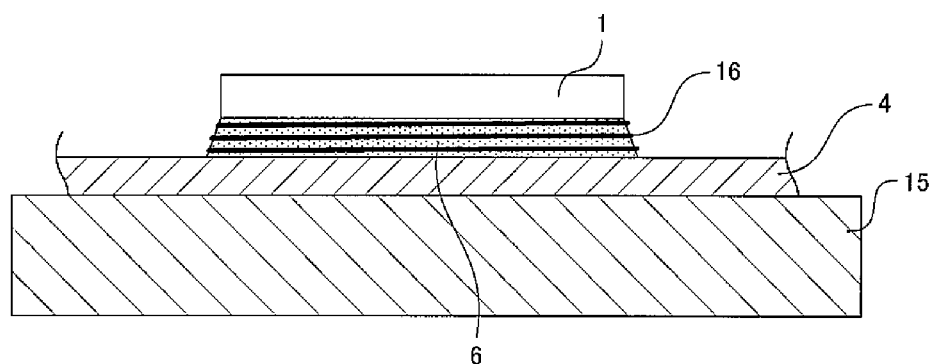
FIG. 38 is an explanatory drawing showing the unevenness layer 16 formed by diagonally applying the second resin 162 like a spiral at predetermined intervals.

In this example, the second resin 162 is formed in a mesh pattern or is longitudinally formed like slides at predetermined intervals on the fillet. As shown in FIG. 38, the unevenness layer 16 may be formed by diagonally applying the second resin 162 like a spiral at predetermined intervals.

Ninth Embodiment

FIGS. 39 to 44 show a ninth embodiment of the present invention.

Figure 39:
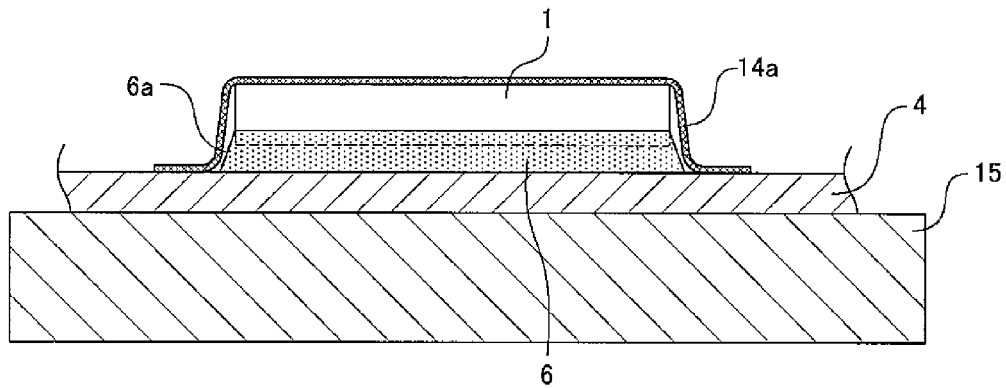
FIG. 39 is a sectional view showing that a film sheet processed in a net pattern is placed on a semiconductor chip according to a ninth embodiment of the present invention.
Figure 40:
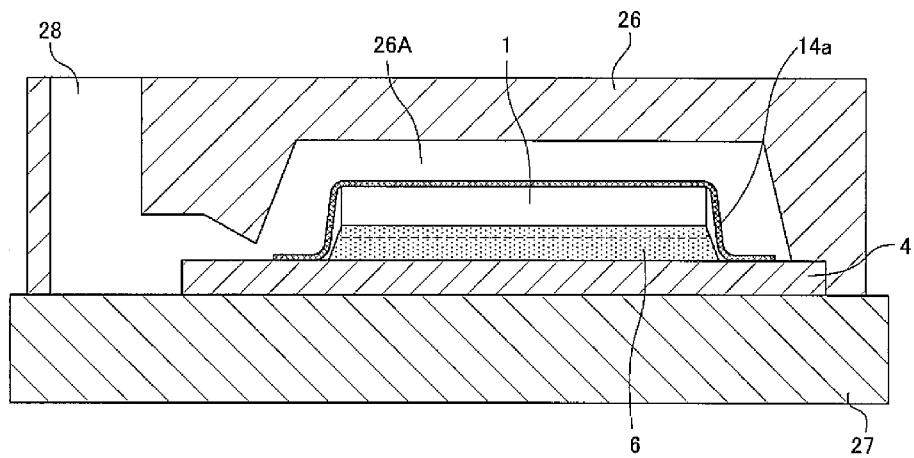
FIG. 40 is a sectional view showing that a die is placed to form a cavity according to the ninth embodiment.
Figure 41:
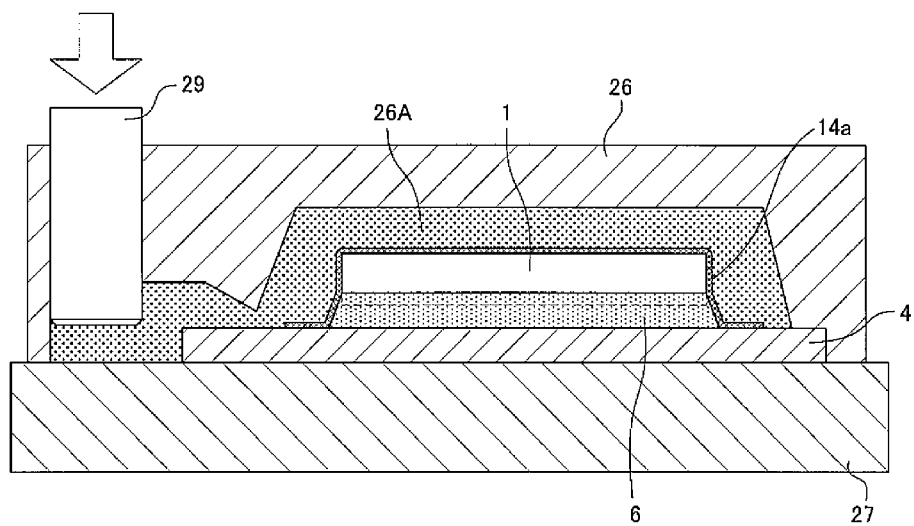
FIG. 41 is a sectional view showing the cavity filled with a molding resin according to the ninth embodiment.
Figure 42:
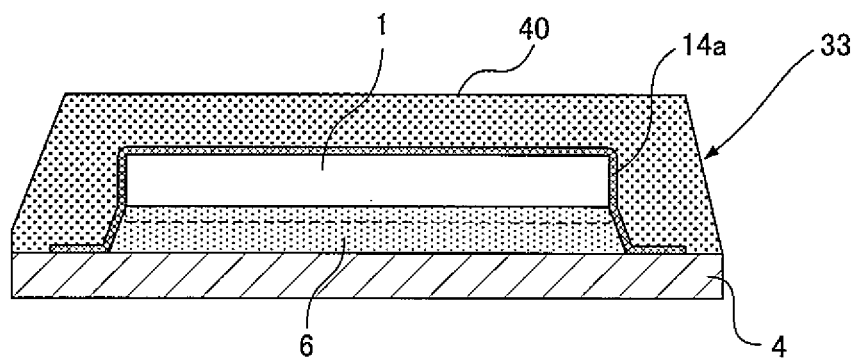
FIG. 42 is a sectional view showing a completed semiconductor device according to the ninth embodiment.

In the eighth embodiment, the unevenness layer 16 is formed on the fillet 6a of the insulating resin 6 by applying the resin with a dispenser and the container 40 is formed thereon, so that the reliability of bonding between the container 40 and the semiconductor chip 1 is mechanically increased. Instead of the application by a dispenser, in the ninth embodiment, a metal film sheet (or a resin film sheet) 14a is processed into a net in an unevenness pattern that is a periodically repeating pattern and is placed on a semiconductor chip 1 as shown in FIG. 39. Then, as shown in FIGS. 40 to 42, a container 40 is formed thereon as in the eighth embodiment, so that an unevenness layer 16 is formed not only on an underfill but also on the top surface and sides of the semiconductor chip 1. FIG. 42 shows a completed semiconductor device in this case.

Figure 43:
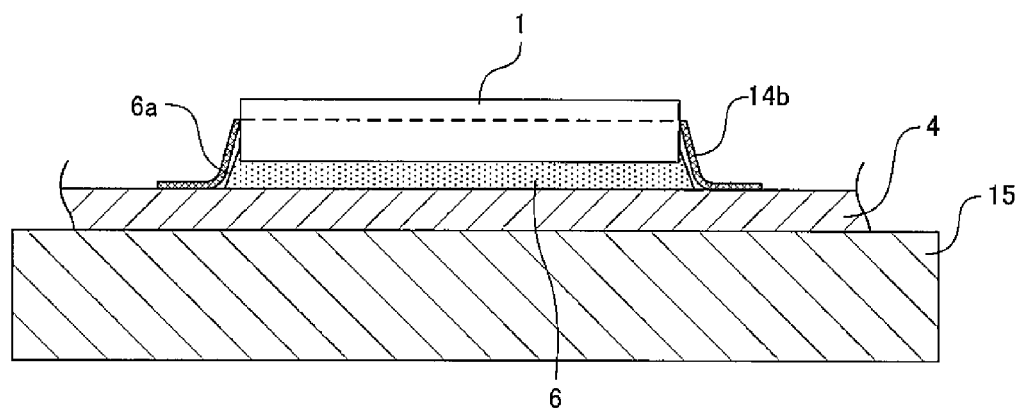
FIG. 43 is a sectional view showing another specific example according to the ninth embodiment.
Figure 44:
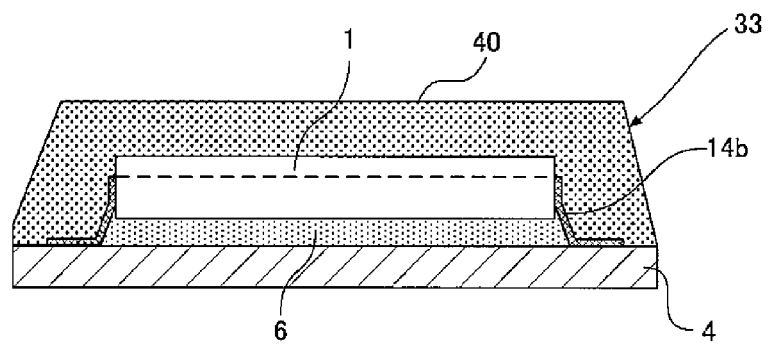
FIG. 44 is a sectional view showing a semiconductor device in the other specific example of the ninth embodiment.
Figure 45:
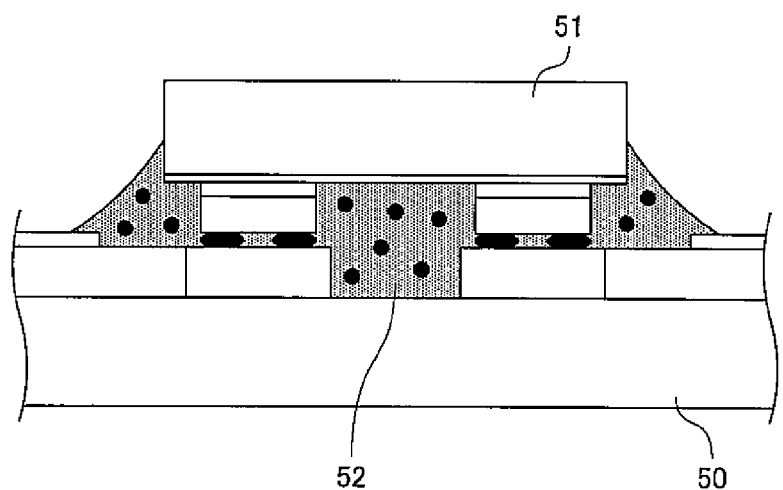
FIG. 45 is a sectional view showing a flip-chip mounting body according to the related art.
Figure 46:
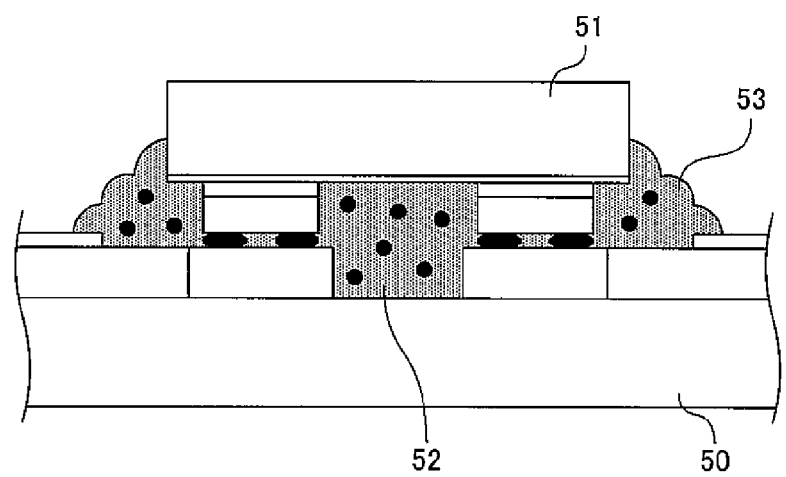
FIG. 46 is a sectional view showing another flip-chip mounting body according to the related art.

In the case where the unevenness layer 16 is formed only on the underfill, as shown in FIG. 43, a metal film sheet (or a resin film sheet) 14b having a hole corresponding to the semiconductor chip 1 is placed on the semiconductor chip 1, and then the container 40 is formed thereon. FIG. 44 shows a completed semiconductor device in this case.

As has been discussed, the flip-chip mounting method of the present invention can manufacture a semiconductor device with high productivity and reliability in a short lead time.

In the foregoing embodiments, the insulating resin 6 was used as an underfill resin. Instead of the insulating resin 6, an anisotropic conductive film (ACF) may be used. Further, when conductive particles (not shown) contained in the anisotropic conductive film are nickel powder plated with gold, it is possible to reduce connection resistance between the terminal electrodes 5 and the bumps 3, thereby achieving high connection reliability. The conductive particles may be resin balls plated with nickel or gold. When the conductive particles are fine particles of solder or the like, it is possible to obtain connection also in an alloyed state from contact connection between the terminal electrodes 5 and the bumps 3, further improving the connection reliability.

In the foregoing embodiments, when the second resin 162 is a conductive resin and the metal film sheet and the resin film sheets 14a and 14b on the semiconductor chip 1 are conductive sheets, the second resin 162 is connected to the terminal electrodes 5 that are connected to the reference potential of, e.g., the ground of the circuit board 4, so that the electric signals and potentials of other signal wires can be stabilized by a shield effect.

Specific examples of the second resin 162 include a dam/fill epoxy resin and a conductive adhesive. Examples of the metal film sheet and the resin film sheets on the semiconductor chip 1 include a mesh-like adhesive resin film sheet, a mesh-like adhesive metal film sheet, a mesh-like metal foil pre-preg circuit board, a mesh-like woven glass epoxy cloth, a string-like glass epoxy cloth, a mesh-like woven organic (aramid) heat-resistant cloth, a string-like woven organic (aramid) heat-resistant cloth, a mesh-like metal thin film, and a mask-pattern etched metal thin film. The film sheets may be punched instead of being formed into strings.

In the foregoing embodiments, the insulating resin 6 was used. Instead of the insulating resin 6, an anisotropic conductive film (ACF) may be used. Further, when conductive particles (not shown) contained in the anisotropic conductive film are nickel powder plated with gold, it is possible to reduce connection resistance between the terminal electrodes 5 and the bumps 3, thereby achieving high connection reliability. The conductive particles may be resin balls plated with nickel or gold. When the conductive particles are fine particles of solder or the like, it is possible to obtain connection also in an alloyed state from contact connection between the terminal electrodes 5 and the bumps 3, further improving the connection reliability.

In the foregoing embodiments, the sheet insulating resin 6 was used as an underfill resin. After a liquid molding resin is dropped to the circuit board 4 and the semiconductor chip 1 is placed thereon, the molding resin may be cured to the underfill resin.

As has been discussed, the flip-chip mounting method of the present invention can manufacture a semiconductor device with high productivity and reliability in a short lead time.

INDUSTRIAL APPLICABILITY

The present invention can contribute to improved performance of, e.g., a small and thin semiconductor device in which a semiconductor chip is flip-chip mounted on a circuit board.

The invention claimed is:
1. A flip-chip mounting method comprising:
    forming a surface unevenness in a periodically repeating pattern on a surface of an insulating resin protruding around a semiconductor chip, while a pressure-bonding tool presses and heats the semiconductor chip positioned with the insulating resin interposed between a circuit board and the semiconductor chip; and
    bonding an inner surface of a container covering the semiconductor chip to the surface unevenness on the surface of the insulating resin, wherein the surface unevenness is formed by pressing the pressure-bonding tool to and around the semiconductor chip through a film and transferring a periodically repeating unevenness pattern on a surface of the film to the surface of the insulating resin protruding around the semiconductor chip.

2. A flip-chip mounting method, wherein a semiconductor chip is flip-chip mounted on a circuit board with an underfill resin interposed between the semiconductor chip and the circuit board and a container covering the semiconductor chip is bonded on the circuit board, the flip-chip mounting method comprising:

forming an unevenness layer by pressing and heating, by a pressure-bonding tool, the semiconductor chip positioned with the underfill resin interposed between the circuit board and the semiconductor chip, and applying a film sheet to a surface of the underfill resin protruding around the semiconductor chip, the film sheet having a surface unevenness in a periodically repeating pattern on a surface of the film sheet; and bonding an inner surface of the container covering the semiconductor chip to the unevenness layer on the surface of the underfill resin.

* * * * *